(12) United States Patent
Oh et al.

(10) Patent No.: US 8,799,730 B2
(45) Date of Patent: Aug. 5, 2014

(54) SEMICONDUCTOR DEVICES AND SEMICONDUCTOR PACKAGES

(75) Inventors: Chi-sung Oh, Gunpo-si (KR); Jung-sik Kim, Seoul (KR); Ho-cheol Lee, Yongin-si (KR); Jung-bae Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/453,447

(22) Filed: Apr. 23, 2012

(65) Prior Publication Data

US 2012/0272112 A1    Oct. 25, 2012

Related U.S. Application Data

(60) Provisional application No. 61/477,769, filed on Apr. 21, 2011.

(30) Foreign Application Priority Data

Aug. 8, 2011   (KR) .................. 10-2011-0078748

(51) Int. Cl.
| | | |
|---|---|---|
| *G01R 31/3177* | (2006.01) | |
| *G01R 31/3185* | (2006.01) | |
| *G01R 31/40* | (2014.01) | |
| *G01R 31/3187* | (2006.01) | |

(52) U.S. Cl.
CPC .... *G01R 31/318555* (2013.01); *G01R 31/3187* (2013.01)
USPC .......................................... 714/727; 714/733

(58) Field of Classification Search
CPC ............... G01R 31/318555; G01R 31/318572; G01R 31/318536; G01R 31/31701; G01R 31/318541; G01R 31/318547; G01R 31/318552; G01R 31/3187; G11C 29/56
See application file for complete search history.

(56) References Cited

U.S. PATENT DOCUMENTS

| 6,272,567 | B1 * | 8/2001 | Pal et al. .......................... 710/56 |
| 6,815,973 | B1 * | 11/2004 | Conn .......................... 324/750.3 |
| 6,841,886 | B2 * | 1/2005 | Nakata et al. .................. 257/778 |
| 7,362,121 | B1 * | 4/2008 | Conn et al. ................ 324/750.06 |
| 7,373,568 | B1 * | 5/2008 | Horovitz ........................ 714/726 |
| 2004/0119497 | A1 * | 6/2004 | Roy et al. ........................ 326/50 |
| 2007/0170587 | A1 * | 7/2007 | Honda .......................... 257/737 |
| 2009/0290282 | A1 * | 11/2009 | Knickerbocker .......... 361/306.2 |
| 2010/0005225 | A1 * | 1/2010 | Honda et al. .................. 711/103 |

(Continued)

FOREIGN PATENT DOCUMENTS

| JP | 2008-010759 A | 1/2008 |
| KR | 100676039 B1 | 10/2006 |
| KR | 20110002732 A | 1/2011 |

*Primary Examiner* — Ajay Bhatia
*Assistant Examiner* — Dipakkumar Gandhi
(74) *Attorney, Agent, or Firm* — Harness, Dickey & Pierce, P.L.C.

(57) ABSTRACT

Semiconductor devices configured to test connectivity of micro bumps including one or more micro bumps and a boundary scan test block for testing connectivity of the micro bumps by scanning data input to the micro bumps and outputting the scanned data. The semiconductor device may include a first chip including solder balls and at least one or more switches electrically coupled with the respective solder balls, and a second chip stacked on top of the first chip and electrically coupled with the switches in direct access mode, including micro bumps that input/output signals transmitted from/to the solder balls.

22 Claims, 18 Drawing Sheets

(56) References Cited

U.S. PATENT DOCUMENTS

| | | | |
|---|---|---|---|
| 2010/0246152 A1* | 9/2010 | Lin et al. | 361/783 |
| 2011/0204357 A1* | 8/2011 | Izuha | 257/48 |
| 2012/0096322 A1* | 4/2012 | Huh et al. | 714/719 |

* cited by examiner

SEMICONDUCTOR DEVICES AND SEMICONDUCTOR PACKAGES

CROSS-REFERENCE TO RELATED APPLICATIONS

This application claims the benefit of U.S. Provisional Patent Application Ser. No. 61/477,769, filed in the U.S. Patent and Trademark Office (USPTO) on Apr. 21, 2011, and claims priority to Korean Patent Application No. 10-2011-0078748, filed on Aug. 8, 2011, in the Korean Intellectual Property Office (KIPO), the entire contents of each of which are incorporated herein by reference.

BACKGROUND

1. Field

Example embodiments of the inventive concepts relate to semiconductor devices, and more particularly, to semiconductor devices configured to test connectivity of micro bumps.

2. Description of the Related Art

Electronic industries have rapidly developed. Electronic products have become more lightweight and compact, with high operating speeds, multi-functions, and multi-performances. One of a variety of electronic product assembly technologies is chip scale packaging or chip size packaging. The chip scale packaging significantly reduces thicknesses or dimensions of semiconductor packages. In the event of stacking semiconductor devices in a chip scale package, micro bumps should be disposed to facilitate easier physical contact between the semiconductor devices.

SUMMARY

Example embodiments of the inventive concepts may provide semiconductor devices and systems for testing the connectivity of micro bumps of stacked semiconductor devices.

According to at least one example embodiment of the inventive concepts, a semiconductor device includes at least one or more through electrodes, at least one or more micro bumps, and a boundary scan test block for testing connectivity of the micro bumps by scanning data input to the micro bumps and outputting the scanned data.

The boundary scan test block may include a mode controller for inputting a scan enable signal, a scan shift signal, and a scan clock to control operation modes of a scan chain, and the scan chain having a first selection unit and a first flip-flop connected in series. The first selection unit of the scan chain inputs a scan input signal to a first input, inputs data of a first micro bump to a second input, and selects and outputs the first input or the second input in response to the scan shift signal. The first flip-flop outputs an output of the first selection unit according to the scan clock. The output of the first flip-flop may be output as a scan output signal.

The scan chain may include a second selection unit and a second flip-flop connected to the serially connected first selection unit and the first flip-flop. The output of the first flip-flop is input to a first input of the second selection unit, data of a second micro bump is input to a second input of the second selection unit, the second selection unit selects and outputs its first or second input, and the second flip-flop outputs the output of the second selection unit as a scan output signal according to the scan clock. The mode controller may set up parallel-in mode, in which signals of all the at least one or more micro bumps are input according to the scan shift signal.

The mode controller may set up serial-out and shift mode, in which the signals input to the at least one or more micro bumps according to the scan shift signal are shifted according to the scan clock and output as the scan output signal. The mode controller may set up serial-in/out and shift mode, in which the scan input signal is input according to the scan shift signal, the input scan input signal is shifted according to the scan clock and output as the scan output signal. The scan enable signal, the scan shift signal, the scan clock, the scan input signal, and the scan output signal may be transmitted through test pads of the semiconductor device.

According to other example embodiments of the inventive concepts, a semiconductor device includes multiple channels with a plurality of micro bumps, and boundary scan test blocks for testing connectivity of the micro bumps by scanning data input to the micro bumps in parallel or in series and outputting the scanned data. The boundary scan test blocks of the multiple channels are connected to each other, and the connectivity of all micro bumps is tested.

Each of the boundary scan test blocks may include a mode controller for inputting a scan enable signal, a scan shift signal, and a scan clock to control operation modes of a scan chain and the scan chain having a first selection unit and a first flip-flop connected in series. The first selection unit of the scan chain may input a scan input signal to a first input, input data of a first micro bump to a second input, and select and output the first input or the second input in response to the scan shift signal. The first flip-flop may output an output of the first selection unit according to the scan clock. The output of the first flip-flop may be output as a scan output signal.

The scan chain may include a second selection unit and a second flip-flop connected to the serially connected first selection unit and the first flip-flop. The output of the first flip-flop may be input to a first input of the second selection unit, data of a second micro bump may be input to a second input of the second selection unit, the second selection unit may select and output its first or second input, and the second flip-flop may output the output of the second selection unit as a scan output signal according to the scan clock. The scan output signal of the channel's boundary scan test block may be provided as the scan input signal to a neighboring channel's boundary scan test block.

The mode controller may set up parallel-in mode, in which signals of all the at least one or more micro bumps are input according to the scan shift signal. The mode controller may set up serial-out and shift mode, in which the signals input to the at least one or more micro bumps according to the scan shift signal are shifted according to the scan clock and output as the scan output signal. The mode controller may set up serial-in/out and shift mode, in which the scan input signal is input according to the scan shift signal, the input scan input signal is shifted according to the scan clock and output as the scan output signal. The scan enable signal, the scan shift signal, the scan clock, the scan input signal, and the scan output signal may be transmitted through test pads of the semiconductor device.

According to still other example embodiments of the inventive concepts, a semiconductor package includes a first chip including solder balls and at least one or more switches electrically coupled with the respective solder balls, and a second chip stacked on top of the first chip and electrically coupled with the switches in direct access mode, including micro bumps that input/output signals transmitted from/to the solder balls. The first chip may include a first input/output buffer, which is connected to the solder balls, for connecting to an external interface of the semiconductor package. The first input/output buffer may have a driving capability to drive signals for the external interface. The second chip may include a second input/output buffer, which is connected to the micro bumps but is not required to have the driving capability as the first input/output buffer has.

The first input/output buffer may have an electrostatic discharge protecting circuit for signal reception through the external interface. The second chip may include a second input/output buffer, which is connected to the micro bumps, the second input/output buffer is not required to have the electrostatic discharge protection circuit as the first input/output buffer has. The second chip may include multiple channels with the plurality of micro bumps, and is a memory device for performing independent read/write operations per channel. The semiconductor package may include as many switches as necessary to test the second chip, the switches being each connected to each of the micro bumps, in the direct access mode. The micro bumps of the channels may be connected together to test the second chip.

According to at least one example embodiment, a semiconductor package includes a first chip including at least one solder ball and at least one switch electrically connected to the at least one solder ball, a second chip stacked on the first chip and electrically connected to the at least one switch in a direct access mode, the second chip including at least one micro bump configured to input/output signals transmitted from/to the solder balls, and a semiconductor device including at least one through electrode, at least one micro bump and at least one boundary scan test block configured to test micro bump connectivity by scanning data input to the micro bump of the semiconductor device and outputting the scanned data.

BRIEF DESCRIPTION OF THE DRAWINGS

Example embodiments will be more clearly understood from the following detailed description taken in conjunction with the accompanying drawings.

FIG. 1 is a cross-sectional diagram illustrating semiconductor packages including stacked semiconductor devices according to example embodiments of the inventive concepts;

FIG. 2 is a block diagram illustrating a first memory layer of FIG. 1;

FIG. 3 is a block diagram illustrating part of ball map of micro bumps illustrated in FIG. 2;

FIG. 4 is a circuit schematic illustrating a boundary scan test block illustrated in FIG. 2;

FIG. 5 is an operational timing diagram of a boundary scan test block of FIG. 4;

FIG. 6 is a block diagram illustrating a relationship between boundary scan test blocks illustrated in FIG. 2;

FIG. 7 is a block diagram illustrating semiconductor packages that may be used to implement at least one example embodiment including a direct access test (DAT) method;

FIG. 8 is a block diagram illustrating a DQ mapping between micro bumps and test pads of FIG. 2;

FIG. 9 is a block diagram illustrating a correlation scheme between data write/read operations through micro bumps and through test pads of FIG. 2;

FIG. 10 is a timing diagram of a read strobe (QS) function and power reduction depending on a number of QS pins in a first memory layer of FIG. 2;

FIG. 11 is a block diagram illustrating a scheme for dual period refresh of the first memory layer of FIG. 2;

FIG. 12 includes images of a fabricated Wide I/O DRAM with micro bumps according to example embodiments including a first memory layer of FIG. 2;

FIG. 13 is a Shmoo plot illustrating a measured voltage characteristic vs. frequency for a Wide I/O DRAM of FIG. 12;

FIG. 14 includes an image of probed bumps and a block diagram of a location of representative bumps from among micro bumps of a Wide I/O DRAM of FIG. 12;

FIG. 15 includes a block diagram and images of a vertical section of 2-stacked Wide I/O DRAMs;

FIG. 16 is a block diagram illustrating a standard fine ball grid array (FBGA) package configuration of 2-stacked Wide I/O DRAMs;

FIG. 17 is a block diagram illustrating a boundary scan test configuration of through-silicon vias (TSVs) in 2-stacked Wide I/O DRAMs;

FIG. 18 is a block diagram illustrating a configuration of 4-stacked Wide I/O DRAMs;

FIG. 19 is a circuit schematic of an independent 4-channel memory device, each channel being arranged in a quadrant of FIG. 2;

FIG. 20 is a block diagram illustrating electronic system applications including semiconductor devices according to example embodiments;

FIG. 21 is a block diagram illustrating a memory system application using a semiconductor device according to example embodiments; and FIG. 22 is a block diagram illustrating a memory system application using a semiconductor device according to other example embodiments.

Figure 1:
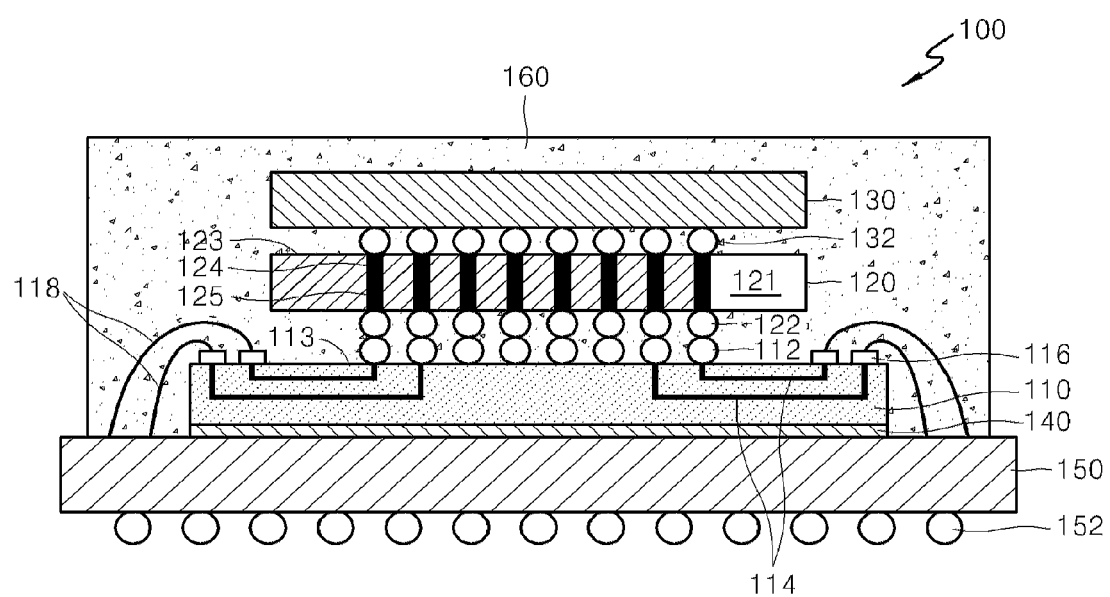
FIGS. 1-22 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. Although example embodiments are described with respect to logic 'high' and logic 'low,' example embodiments are not limited to the particular logic scheme, which is used for ease of description. For example, the logic levels may be reversed such that a described logic 'high' is a logic 'low' and a described logic 'low' is a logic 'high.'

A chip-scale package size may be less than about 1.2 times a chip size. The chip-scale package may be mainly used in products requiring miniaturization and mobility, for example, digital camcorders, cell phones, laptops and/or memory cards. For example, semiconductor devices (e.g., digital signal processors (DSPs), application specific integrated circuits (ASICs), microcontrollers, and/or the like) may be contained in a chip-scale package.

Although chip-scale packages may be advantageous in terms of size, there may be disadvantages. It may be difficult to secure reliability. There may be a high demand for additional manufacturing equipment and raw or subsidiary materials. Chip-scale packages may be manufactured at relatively high cost and may not be cost competitive. Once a semiconductor wafer is manufactured through a conventional wafer manufacturing process, individual chips may be separated from the wafer and then may go through a package assembly process.

Wafer-level chip-scale packages may not be subject to these disadvantages. Although the package assembly process may be a purely separate process from the wafer manufacturing process, in the chip-scale package scheme, a package may be manufactured as an end product without separating individual chips from the wafer. Existing manufacturing facilities and processes may also be used for manufacturing the wafer level chip-scale packages. Waste of raw/subsidiary material may be reduced.

Stack packages are three-dimensional stacks of wafer level chip-scale packages. Three dimensional stacking of the chip-scale packages may require electrical contact between chip-scale packages. A technology of forming through-holes that pass through a semiconductor chip and through-electrodes in the through-holes may be used. As a way of forming the through-electrodes, holes may be formed to a target depth, and may pass though chip pads of the semiconductor chip. An under bump metal (UBM) layer may be formed inside the holes including the chip pads, and the holes may be filled with a metal. A rear part of the wafer may be polished to expose a front-end part of the metal layer. The front-end part of the metal layer that may be exposed on the polished rear part of the wafer may be used as an external connection terminal in stacking packages.

In order to electrically contact the stacked chip-scale packages with each other, metal bumps may be formed on either side of the holes. As a way of forming the metal bumps, the UBM layer may be first formed on the location where the metal bump will be formed, and then a plating method may be used in which a photolithography process may be performed with a sensitive film. In order to electrically connect the stacked chip-scale packages with each other, a solder ball may be stricken and accreted to form the solder ball on the projected part, which may be the part of the metal layer formed in the holes and exposed to the outside.

FIG. 1 is a cross-sectional diagram illustrating semiconductor packages including stacked semiconductor devices according to example embodiments of the inventive concepts. Referring to FIG. 1, a semiconductor package 100 may be configured with two-stacked memory layers, a first memory layer 120 and a second memory layer 130, on a bottom chip 110. The bottom chip 110 and the first memory layer 120 may be electrically connected by micro bumps 132. The bottom chip 110 and the first and second memory layers 120 and 130 may be stacked on a printed circuit board 150 with an adhesive.

The bottom chip 110 may be an interface chip for interfacing with the outside of the semiconductor package 100. The bottom chip 110 may include at least one chip pad 116 that may serve as an external input/output (I/O). The external I/O herein may indicate a data input/output between the bottom chip 110 and the PCB 150. The chip pads 116 of the bottom chip 110 may be electrically connected to the PCB 150 via bonding wires 118. The bottom chip 110 may be a memory controller for controlling operations of the first and second memory layers 120 and 130.

The bottom chip 110 may be mounted face-up in the semiconductor package 100 with its active surface 113 facing upward. Integrated circuit patterns may be on the active surface 113. Micro bumps 112 may be on the active surface 113 of the bottom chip 110. According to at least one example embodiment, the micro bumps 112 may be on electrode pads (not shown) formed on the active surface 113. The micro bumps 112 may be electrically connected to the chip pads 116 via the integrated circuit patterns and by signal routing 114. The micro bumps may be formed in a hemispherical or convex shape, and may include, for example, nickel (Ni), gold (Au), copper (Cu), and/or a soldered alloy. A diameter of the micro bumps 112 may about 8 μm to 50 μm.

The bottom chip 110 may be electrically connected to micro bumps 122 of the first memory layer 120, and may serve as an internal input/output (I/O). The internal I/O herein may indicate a data I/O between stacked chips, for example, data I/Os between the bottom chip 110 and the first memory layer 120 and between the first and second memory layers 120 and 130. The first and second memory layers 120 and 130 may be memory chips and/or memory dies. The first and second memory layers 120 and 130 may be described as memory chips, but example embodiments are not limited thereto. The first and second memory layers 120 and 130 may be, for example, logic device chips.

In the first memory layer 120, the substrate 121 may include at least one or more through-electrodes 124 that may be in charge of an internal I/O. The at least one or more through-electrodes 124 may pass through one or more vias 125 on the substrate 121. The one or more vias may be filled with conductive material. The at least one or more vias 125 may be formed by, for example, laser etching and/or by dry etching. The through-electrodes 124 may electrically connect the first memory layer 120 and the bottom chip 110, and may have a fine pitch of about 100 μm or less in order to implement a wideband I/O bus. The through electrodes 124 may be used in a dense area.

For implementing the through-electrodes 124, diameters of vias 125 may be minimized and/or reduced, and a so-called via first method of construction may be used to form the vias 125. A data transfer rate may be increased using the through-electrodes 124. Electrical characteristics of the semiconductor package 100 may be improved.

The second memory layer 130 may be a memory chip and/or a logic device that may be mounted on an active area 123 of the first memory layer 120. The second memory layer 130 may be electrically coupled with the first memory layer 120 via the at least one or more micro bumps 132. The micro bumps 132 on the second memory layer 130 may be connected to the first memory layer 120 by, for example, contacting the through-electrodes 124 of the first memory layer 120. A plastic molding compound 160 may fix the stacked bottom chip 110 and the first and second memory layers 120 and 130 and may protect them from the outside environment. The stacked bottom chip 110 and the first and second memory layers 120 and 130 may be electrically connected with an external system through the solder balls 152 of the PCB 150.

In the semiconductor package 100, the micro bumps 112 on the bottom chip 110 and the micro bumps 122 and 132 of the first and second memory layers 120 and 130, respectively, may be electrically connected to each other through the through-electrodes 124. These micro bumps 112, 122, and 132 may determine connectivity between different devices, for example, between the bottom chip 110, the first and the second memory layers 120 and 130. Such connectivity of the micro bumps 112, 122 and 132 may become a main factor in determining whether the semiconductor package 100 is defective or not. Accordingly, a method of detecting poor connectivity of the micro bumps 112, 122, and 132 may be performed.

There may be at least two test methods of detecting poor connectivity of the micro bumps 112, 122, and 132: a boundary scan test (BST) may test whether the micro bumps 112, 122, and 132 are connected to individual devices (e.g., the bottom chip 110, the first and second memory layers 120 and 130); and a direct access test (DAT) may test whether the micro bumps 112, 122, and 132 are connected to the stacked bottom chip 110, and the first and second memory layers 120 and 130. The BST may detect micro bump connection failure with the bottom chip 110, and the first and second memory layers 120 and 130.

Figure 2:
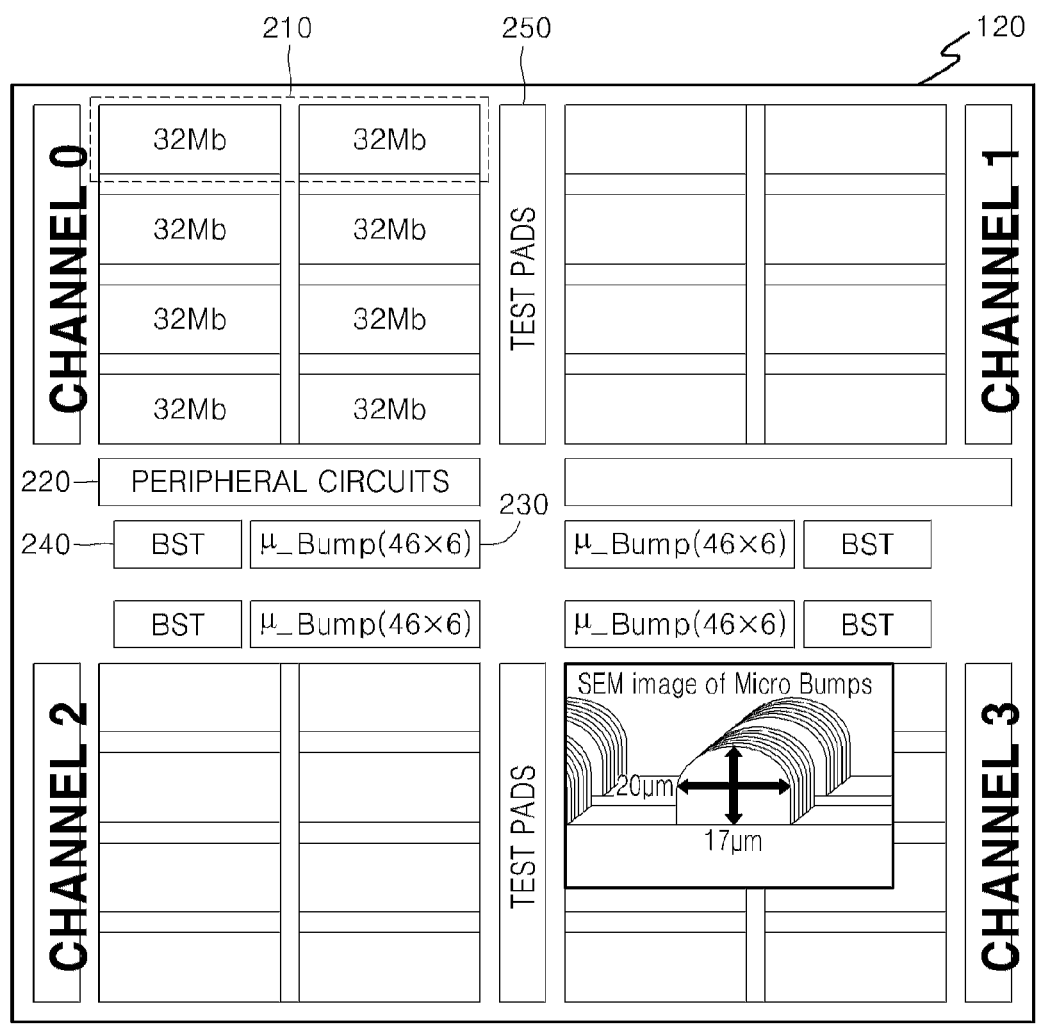
Figure 3:
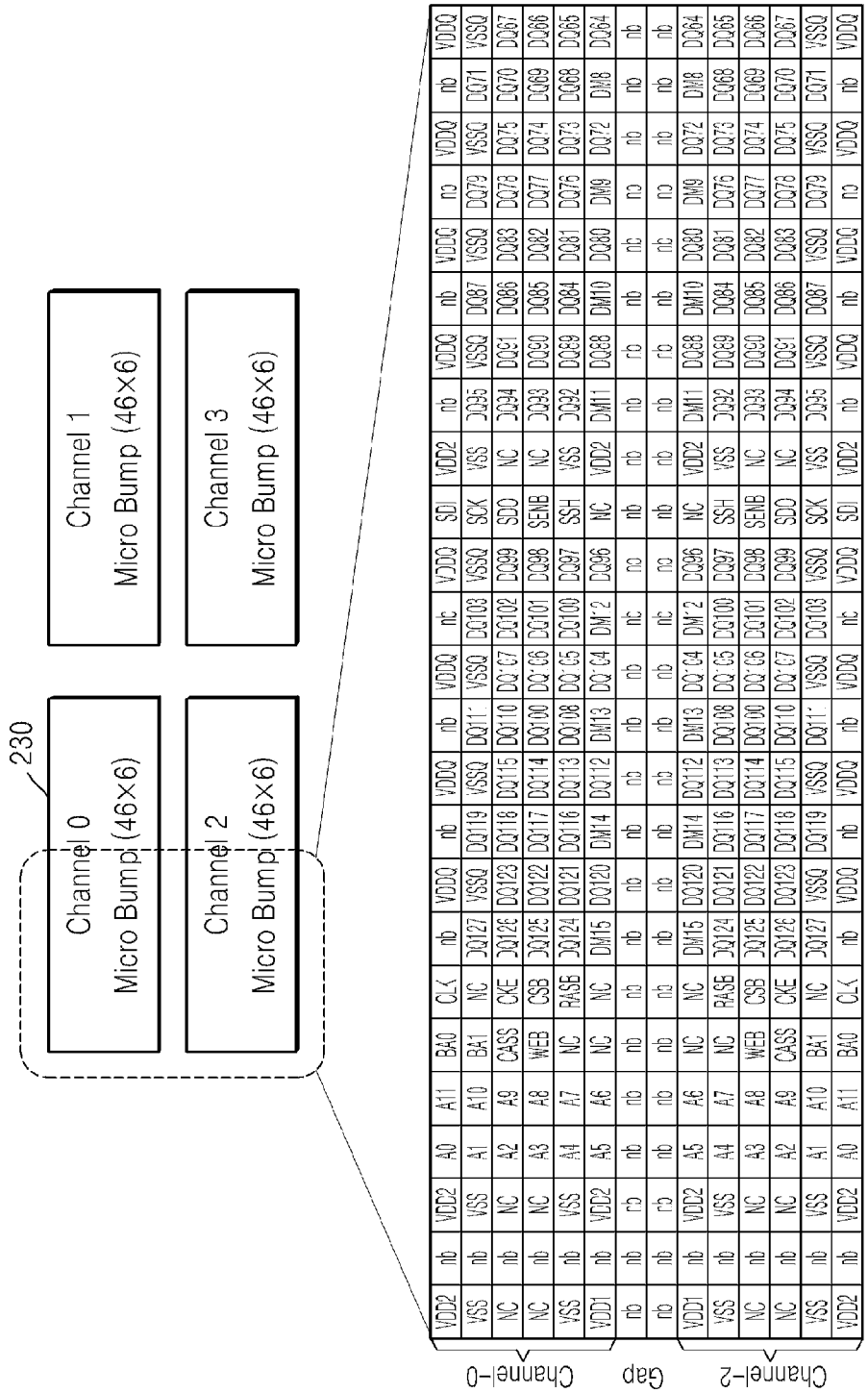

FIG. 2 is a block diagram illustrating a first memory layer of FIG. 1. FIG. 3 is a block diagram illustrating part of ball map of micro bumps in connection with FIG. 2. Referring to FIG. 2, the architecture of the first memory layer 120 with 4-channels and 16 segmented 64 Mb arrays is shown. The first memory layer 120 may be made up of 4 partitions which may be symmetric with respect to chip centered micro bump blocks 230 and test pad blocks 250. Each partition may consist of 4×64 Mb arrays, peripheral circuit blocks 220 and micro bump blocks 230. Each channel may have its own input pins, whereas external power pins and internal voltage generators may be shared with the channels. In a single channel, for example, 128 data lines may be controlled to feed 128 DQs (data input/output), four 64 Mb arrays in 1-channel may be configured as 4 banks with bank addresses BA[0:1] and row addresses RA[0:11] with 4 k row depth, and/or as 2 banks with BA[0] and RA[0:12] with an 8 k row depth. Column addresses may be fixed as CA[0:6] and as a result, each bank may have a 2 k byte page depth.

To reduce power consumption in 512 bit I/O operations (4×128) and to support high data bandwidth, 46×6 micro bumps may be used per channel and located in the center of the chip architecture, and may possibly reduce I/O driver loading. FIG. 2 may also include an illustration of a scanning electron microscope (SEM) image of the fabricated micro bumps with about 20 μm×17 μm size and 50 μm×40 μm pitch. FIG. 3 illustrates a detailed ball map of part of channels 0 and 2. Referring to FIG. 3, addresses and command balls may be located at the edge side, and groups of DQ balls may be repeated per 4 bytes. Referring to FIG. 2, the first memory layer 120 may further include BST blocks 240 to test connectivity of the micro bumps of each channel. The BST block 220 of channel 0 may have its own scan chains and scan clock input. The BST block 220 may scan parallel and/or serial data inputs and the scanned data may propagate through dedicated pins.

Figure 4:
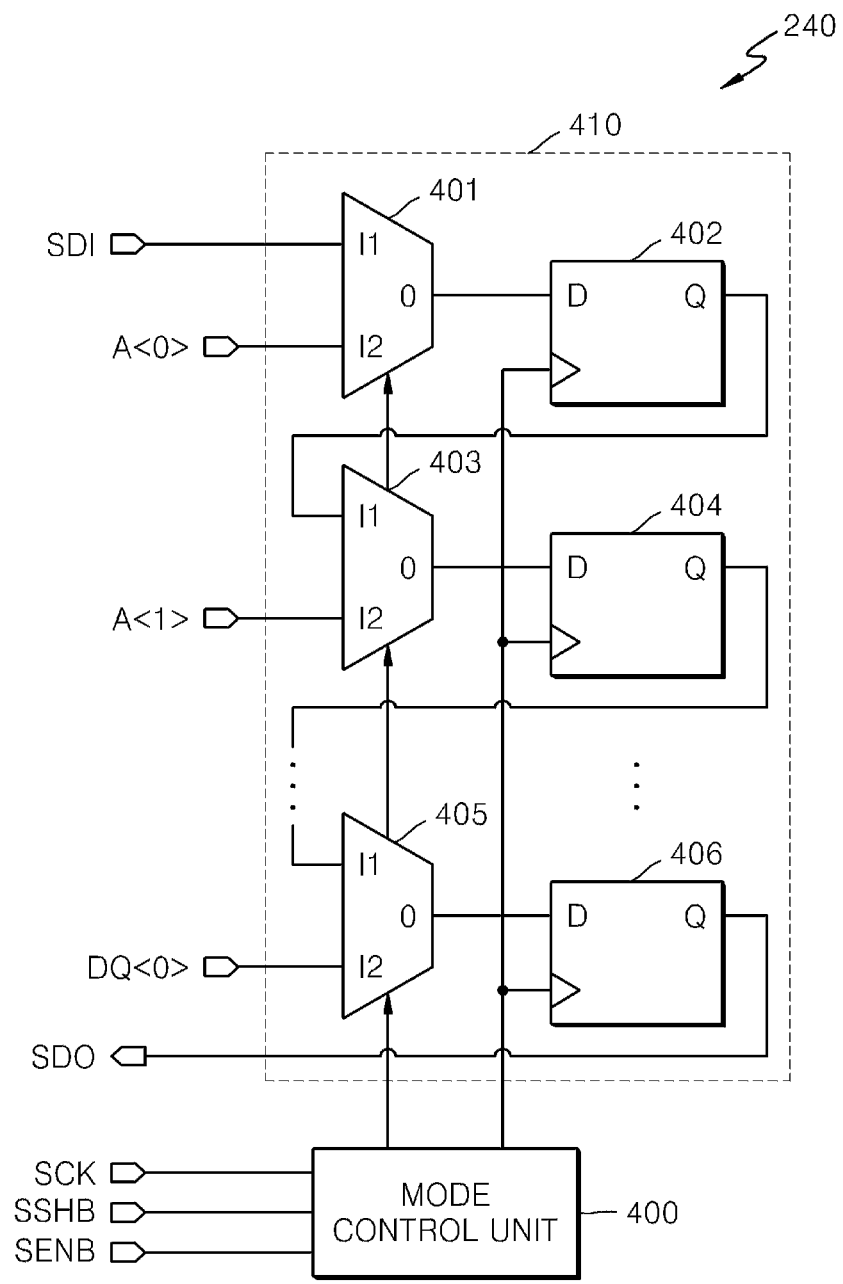

FIG. 4 is a circuit schematic illustrating one boundary scan test block of FIG. 2. Referring to FIG. 4, a BST block 240 may include 5 additional pins dedicated for a scan enable signal (SENB), scan shift signal (SSHB), scan input signal (SDI), scan output signal (SDO), and scan clock signal (SCK), respectively. The five signals may be provided to test pads 250. The scan enable signal SENB may be for enabling a boundary scan chain 410. The scan shift signal SSHB may be for selecting operation modes of the boundary scan chain 410. The signals SDI, SDO and SCK may be for scan input, output and clock, respectively.

The BST block 240 may include several selecting units 401, 403 and 405, several flip-flops 402, 404 and 406, and a mode control unit 400. The several selecting units 401, 403 and 405 and the several flip-flops may constitute the boundary scan chain 410. The mode control unit 400 may receive SENB, SSHB and SCK to control operation modes of the boundary scan chain 410. The mode control unit 400 may enable the boundary scan chain 410 in response to, for example, a logic 'low' level of SENB. The mode control unit 400 may operate the boundary scan chain 410 in parallel-in mode, serial-in/out and shift mode, and serial-out and shift mode.

The boundary scan chain 410 may include a first selecting unit 401 for receiving a scan input through the SDI pin and a first address through an A<0> pin and may select and output one of the scan input and/or the first address in response to a scan shift signal through the SSHB pin. The scan input may be input to a first input I1 of the first selecting unit 401 while the first address may be input to a second input I2 of the first selecting unit 401. The first address may be one of signals input to micro bump pads.

The first selecting unit 401 may select and output the scan input through the SDI pin, which may be input to an input I1 of the first selecting unit 401 when SSHB is high. The first selecting unit 401 may select and output the first address input to I2 when SSHB is low. An output at 0 of the first selecting unit 401 may be provided to a first flip-flop 402. The first flip-flop 402 may receive the output from the first selecting unit 401 at an input D, and may output he output from the first selecting unit 401 at a data output Q in response to a scan clock through the SCK pin. The signal from the data output Q of the first flip-flop 402 may be provided to a second selecting unit 403.

The second selecting unit 403 may receive the signal from the data output Q of the first flip-flop 403 and a second address signal through A<1> pin, and may select and output one of the signal from the data output Q of the first flip-flop 403 and the second address signal in response to the scan shift signal through SSHB pin. The second address may be one of the signals input to micro bump pads. The second selecting unit 403 may select and output the signal from the data output Q of the first flip-flop 403, which may be input to I1 when SSHB is high. The second selecting unit 403 may select and output the second address input to I2 when SSHB is low. An output at 0 of the second selecting unit 403 may be provided to a second flip-flop 404. The second flip-flop 404 may receive the output from the second selecting unit 403 at an input D, and may output the output from the second selecting unit 403 at a data output Q in response to the scan clock through the SCK pin.

In such a manner, selecting units and flip-flops in the boundary scan chain 410 may be cascaded. The boundary scan chain 410 may select a previous flip-flop output which may be input to an input I1 of a selecting unit in response to a logic level 'high' of the scan shift signal through the SSHB pin, and may shift the selected signal in response to the scan clock signal through the SCK pin. The boundary scan chain 410 may select a micro bump pad signal input to an input I2 of a selecting unit and may shift the signal in response to a scan clock signal through the SCK pin.

In the boundary scan chain 410, the flip-flop 406 in the cascade may be connected to the SDO pin for scan output. The last selecting unit 405 may select and output a previous flip-flop output which may be input to the first input I1 of the selecting unit 405 in response to logic level 'high' of the scan shift signal through SSHB pin while possibly selecting and outputting a first data input/output through the DQ<0> pin in response to logic level 'low' of the scan shift signal through the SSHB pin. The first data input/output through DQ<0> may be the last signal of the micro bump pad input to the boundary scan chain 410. An output at 0 of the selecting unit 405 may be provided to the flip-flop 406. The flip-flop 406 may receive the output from the selecting unit 405 at its data input D and may output the data at its data output Q. The output of the flip-flip 406 may be output as the scan output through the SDO pin.

In the boundary scan chain 410, the first and second address signals through A<0> and A<1> pins, which may be signals of the micro bump pads, and the first data input/output through DQ<0> pin may be connected to micro bumps 122 of the first memory layer 120 illustrated in FIG. 1. The BST block 240 may monitor whether the first and second address signals A<0> and A<1> are input to micro bump pads and the first data input/output through DQ<0> may be output through the scan output SDO pin.

If the first and second address signals A<0> and A<1> are input to micro bump pads and the first data input/output through DQ<0> may be output as the scan output signal through the SDO pin, it may be determined that micro bumps 122 may be connected to the first memory layer 120 and thus the memory layer 120 may be accepted. Otherwise, if the first and second address signals A<0> and A<1> pins may be input to micro bump pads and the first data input/output through DQ<0> may not be output through the scan output SDO pin, it may be determined that micro bumps may be open or shorted and may fail to be connected to the first memory layer 120 and thus the first memory layer 120 may be a failure. The binary scan test block 240 tests whether the micro bumps 122 may be connected to the first memory layer 120. The BST block 240 may detect micro bump connection failure with other devices.

Figure 5:
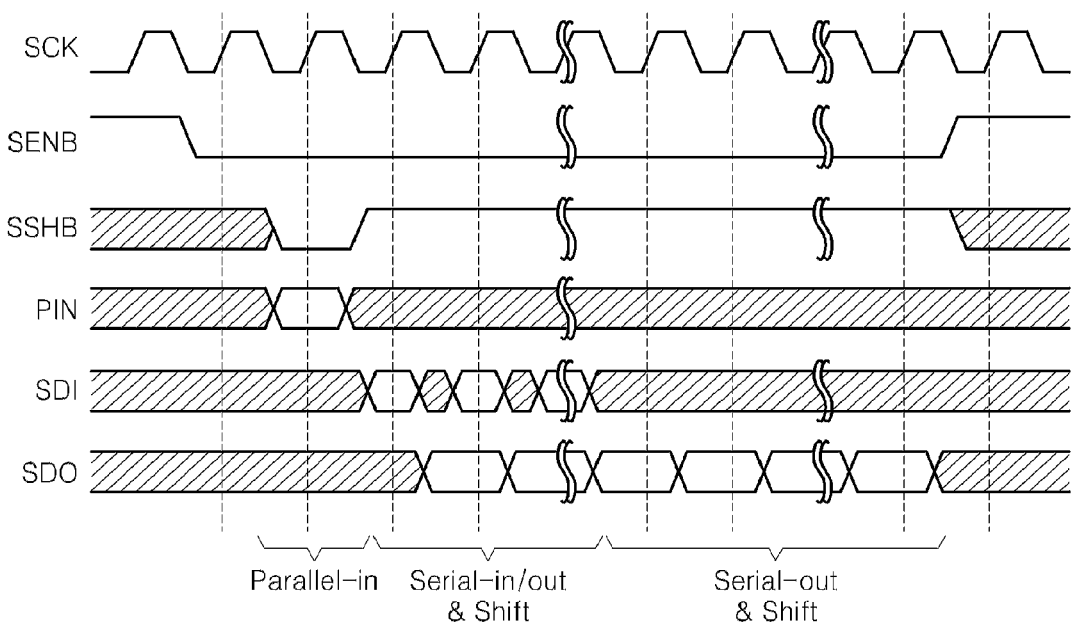

FIG. 5 is an operational timing diagram of a boundary scan test block of FIG. 4. Referring to FIG. 5, the BST block 240 may test the boundary scan chain 410 with three different operation modes. The boundary scan chain 410 may be tested in parallel-in mode, serial-in/out and shift mode, and serial-out and shift mode. The parallel-in mode may be set when the scan shift signal through the SSHB pin may be logic 'low.' In the parallel-in mode, signals are input through all bump pads. The serial-out and shift mode may be set when the scan shift signal through the SSHB pin may be logic 'high.' In the serial-out and shift mode, signals may be input through the micro bump pads PIN may be shifted according to each clock signal through the SCK pin and may be output through the scan output SDO pin.

The serial-in/out and shift mode may be set when the scan shift signal through the SSHB pin may be logic 'high.' In the serial-in/out and shift mode, signals may be input though the scan input SDI pin and the input signals may be shifted according to each clock signal through the SCK pin and may be output through the scan output SDO pin. The BST block 240 may monitor whether signals input to micro bump pads PIN may be output through the scan output SDO pin. In the present example embodiment a connectivity test of micro bumps 122 in channel 0 has been described while a connectivity test of micro bumps 122 in other channels (e.g., channel 1, channel 2, and channel 3) may be conducted by, for example, connecting BST blocks 240 and 241 with each other, as shown in FIG. 6.

Figure 6:
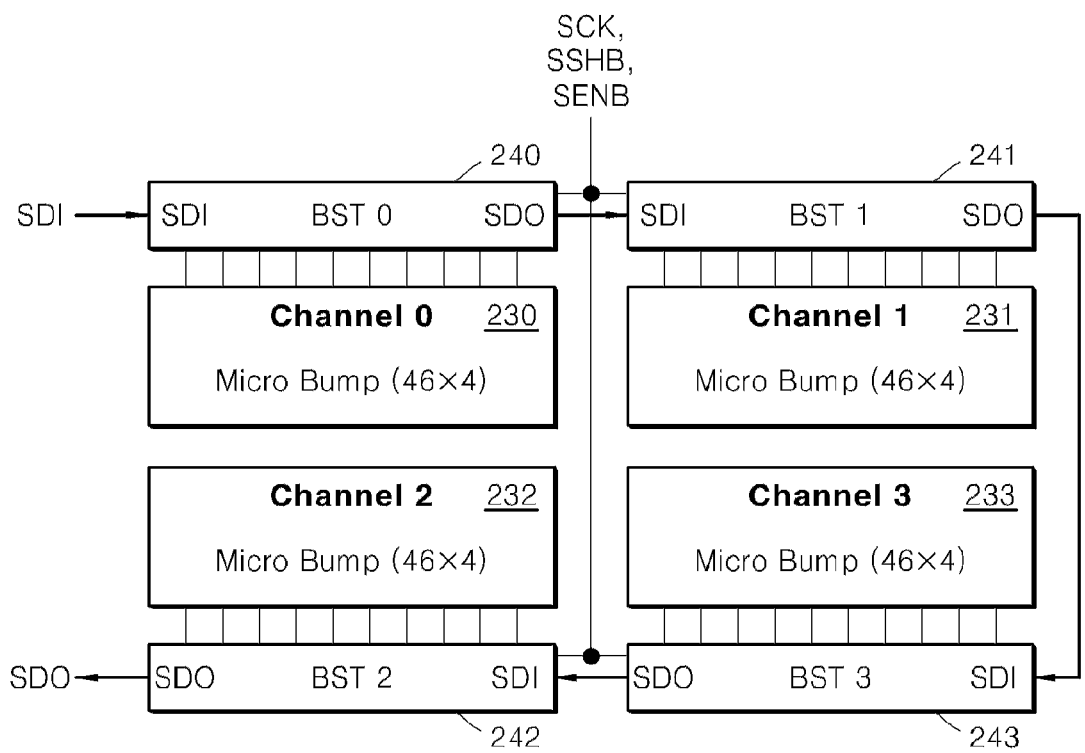

FIG. 6 is a block diagram illustrating a relationship between boundary scan test blocks in connection with FIG. 2. Referring to FIG. 6, the micro bump block 230 of channel 0 may be connected to the first BST block 240, the micro bump block 231 of channel 1 may be connected to the second BST block 241, a micro bump block 232 of channel 2 may be connected to a third BST block 242, and a micro bump block 233 of channel 3 may be connected to a fourth BST block 243. Each of the first to fourth BST blocks 240-243 may share a scan clock at the SCK pin, a scan shift signal at the SSHB pin, and a scan enable signal at the SENB pin.

Each of the first to fourth BST blocks 240-243 may enter the parallel-in mode when the scan shift signal at the SSHB pin may be logic 'low.' Signals from the first to fourth BST blocks 240-243 may be input to all micro bump pads PIN of the micro bump blocks 230-232, respectively. Each of the first to fourth BST blocks 240-243 may enter serial-out and shift mode when the scan enable signal at the SENB pin may be logic 'low' and may enter serial-in/out and shift mode when the scan enable signal at the SENB pin may be logic 'high'. Signals from the first to fourth BST blocks 240-243 may be input to all micro bump pads PIN of the micro bump blocks 230-232, respectively.

Each of the first and fourth BST blocks 240-243 may enter the serial-out and shift mode when the scan enable signal at SENB pin may be logic 'low' and may enter the serial-in/out and shift mode when the scan shift signal at SSHB pin may be logic 'high.' In the serial-out and shift mode, signals to micro bump pads PIN from the first and fourth BST blocks 240-243 may be shifted according to each of scan clocks at the SCK pin and may be output as the scan output signal at the SDO pin.

The scan output signal at the SDO pin of the first BST block 240 may be provided to a scan input SDI pin of the second BST block 241. A scan output signal at the SDO pin of the second BST block 241 may be provided to a scan input SDI pin of the fourth BST block 243. A scan output signal at the SDO pin of the fourth BST block 243 may be provided to the scan input SDI pin of the third BST block 242. The signal input through the SDI pin of the third BST block 242 may be shifted according to each of the scan clocks through the SCK pin and then may be output as a scan output signal through the SDO pin. The first to fourth BST blocks 240-243 may test connectivity of all micro bumps of channels 0-3.

According to at least one example embodiment, a connectivity test of all the micro bumps 122 of the first memory layer 120 with the first to fourth BST blocks 240-243 of the first memory layer 120 has been described. According to at least one example embodiment, the bottom chip 110 may employ such BST blocks to test the connectivity of micro bumps 112 of the bottom chip 110. According to at least one example embodiment, the second memory 130 may employ such BST blocks to test the connectivity of micro bumps 132 of the second memory 130.

In the semiconductor package 100 of FIG. 1, the bottom chip 110, the first and second memory layers 120 and 130 may be, for example, stacked, adhered to the PCB 150, fixed by a plastic molding compound, and package assembled to be connected to solder balls 152 of the PCB 150. After the package assembly, the connectivity of the stacked bottom chip 110, and the first and second memory layers 120 and 130 to micro bumps 112, 122, and 132 via through electrodes 124 may be tested. The connectivity of the micro bumps 112, 122 and 132 to the through electrodes 124 may make it possible to test operations of a device that may be stacked in the middle of the semiconductor package 100, for example, the first memory layer 120.

Figure 7:
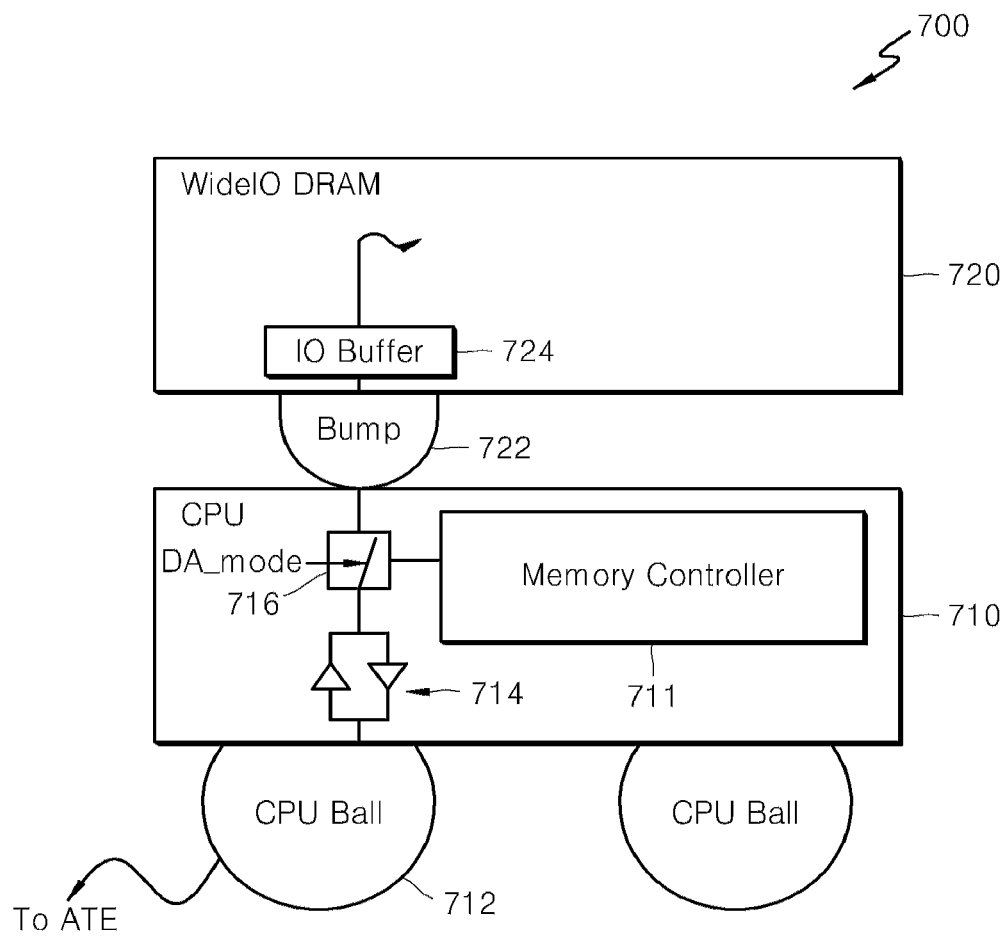

FIG. 7 is a block diagram illustrating semiconductor packages that may be used to implement at least one example embodiment including a direct access test (DAT) method. The semiconductor package 100 may employ a function of a direct access test (DAT). Referring to FIG. 7, the semiconductor package 700 illustrates a structure in which there may be a bottom chip 710 and a top chip 720 that may be stacked. For example, the bottom chip 710 may be a central processing unit (CPU) that may include a memory controller 711, and the top chip 720 may be a memory chip, for example, a Wide IO DRAM. The top chip 720 may be similar or identical to the first memory layer 120 as described above. The memory controller 711 may control read/write operations of the top chip 720, which may be a memory chip.

The bottom chip 710 may be electrically connected to an external system through CPU balls 712. The CPU balls 712 may be of a greater volume and height than that of a micro bump 722. The CPU balls 712 of a greater size may bear external stresses relatively well and/or may be improved with respect to external stress, and may further improve mechanical durability of the semiconductor package 700. The bottom chip 710 may further include input/output buffers 714 and a switch 716. The input/output buffers 714 may be electrically coupled to the CPU ball 712 and may forward a signal input to the CPU ball 712 to inside of the bottom chip 710 and/or may forward a signal within the bottom chip 710 to the CPU ball 712. Considering an external interface, the input/output buffers 714 may be equipped with I/O drivers including a large and/or increased driving and receiving capability and electrostatic discharge (ESD) circuitry.

The switch 716 may forward a signal from the CPU ball 712 through the input/output buffer 714 to the memory controller 711 and/or to the micro bump 722 of the top chip 720 in response to a direct access mode signal DA_mode. The DA_mode may be a signal provided from the outside of the semiconductor package 700 and may be provided through the CPU ball 712. For example, the DA_mode may be provided from automatic test equipment (ATE) for testing the semiconductor package 700. The switch 716 may forward a signal from the CPU ball 712 through the input/output buffers 714 to the micro bump 722 of the top chip 720 when DA_mode may be activated to be logic 'high.' The switch 716 may forward a signal from the CPU ball 712 through the input/output buffers 714 to the memory controller 711 when DA_mode may be inactivated to be logic 'low.'

The top chip 720 may include an input/output buffer 724 that may be electrically coupled with the micro bump 722. The input/output buffer 724 may forward a signal input to the micro bump 722 into the top chip 720, and/or may forward a signal within the top chip 720 to the micro bump 722. The top chip 720 may correspond to a memory chip that may perform read/write operations according to a signal that may be forwarded from the micro bump 722.

There may be no need for large I/O drivers and ESD circuitry in the top chip 720 because signals that may be forwarded to the top chip 720 may go through the CPU ball 712 of the bottom chip 710. In the event that the top chip 720 may be configured to be the first memory layer 120 of FIG. 2, the top chip 720 may include four channels, each channel may have 128 data lines that may be connected to 128 DQ pins. The top chip 720 may correspond to a DRAM that may be capable of performing 512-bit wide I/O operations. Micro bumps of each channel of the top chip 720 may be connected to 128 DQs, bank addresses BA[0:1], row addresses RA[0:12], column addresses CA[0:6], clock CK, clock enable CKE, /RAS, /CAS, write enable /WE, data mask DM signals, and the like (see FIG. 3). Each channel may be operated for read/write operations on x128 DQs in a normal mode.

The top chip 720 may connect micro bumps of the four channels by merging them to reduce test times. For example, micro bumps of each channel may be set to operate on x8 DQs according to a separate chip select signal /CS. The four channels may share 8 DQs, and the 8 DQs may be assigned to a corresponding channel according to four /CS signals. The four channels may be set to share the bank addresses BA[0], addresses A[0:12], clock CK, clock enable CKE, /RAS, /CAS, write enable /WE, and data mask DM signals. Micro bumps may be configured separately in normal and DA modes, as shown in Table 1.

TABLE 1

|  | Normal Mode | Direct Access (DA) mode |
|---|---|---|
| DQs | x128/channel | x8/channel |
| Addresses | BA[0:1] | BA[0:1] |
|  | RA[0:11] | RA[0:11] |
|  | CA[0:6] | CA[0:11] |
| Operation | x128/channel, internally | x8/channel, internally |

In DA mode, each channel may be operated as SDRx8 with a separate chip select (/CS) pin, and by merging 4 /CS pins in all channels, the top chip 720 may be operated as SDRx32 with 1 /CS pin. The top chip 720 may be tested on read/write operations with signals that may be applied to 32 micro bumps, as shown in Table 2, with a total of 32 pins.

TABLE 2

| Pin Name | Number of Pins | Remarks |
|---|---|---|
| /CS | 4 (1 per channel) | Individually for each channel |
| A0-A12, BA0 | 14 | Addresses/commands/DQs shared by all channels |
| CK, CKE, /RAS, /CAS, /WE | 5 | |
| DM(QS) | 1 | |
| DQ | 8 | |

The semiconductor package 700 according to at least one example embodiment illustrates a switch 716 that may be connected between the CPU ball 712 of the bottom chip 710 and the micro bump 722 of the top chip 720. For the top chip test in DA mode, the bottom chip 710 may include 32 switches 716 that may connect 32 CPU balls 712 to 32 micro bumps 722. The semiconductor package 700 may include a number of switches that may be connected to the same number of micro bumps in order to test the top chip 720 in DA mode.

As one example, the first memory layer 120 herein may be fabricated with 50 nm technology, to be a 1.2V 1 Gb SDRAM with 4 channels and 512 DQs. The first memory layer 120 may consume 330.6 mW power for a read operation while operating 4 channels, and may have a 12.8 GB/s data bandwidth. Test correlation techniques may verify functions of the first memory layer 120 through micro bumps and test pads. A block based dual period refresh scheme may be applied to reduce a self refresh current with minimum chip size burden. The fabrication of a semiconductor package 100 with about a 7.5 μm diameter through electrodes (through-silicon vias (TSVs)) may have 76% overall package yield without any difference in performances between top and bottom chips.

Mobile DRAMs may be widely employed in portable electronic devices due to their feature of low power consumption. Where various features are integrated in one chip, mobile DRAMs may be of low power consumption, high capacity and high speed. High capacity may be acquired by assembling more arrays and/or multiple chips in a package, but high speed and low power consumption may not be easily obtained simultaneously. To overcome this difficulty, an increase in operating frequency concurrent with the scaling down of operating voltage has been tried in various ways. Low Power Double Data Rate 2 (LPDDR2) may satisfy both demands for speed and power consumption. The overall battery lifetime in mobile devices may depend on power consumed in operations like standby and self refresh, possibly leading to more room to gain high operating speed and low power consumption.

Most approaches to fulfill both requirements may be classified into two general approaches. One approach may be a constitution of a multi-channel device with high speed I/O characteristics. It may mostly be made up of 2-channels for higher data bandwidth, but advanced I/O circuitries may be needed to achieve high frequency I/O characteristics. Another general approach may be stacking of multiple Wide I/O memories with a large number of I/O pins. In this approach, high data bandwidth may be easily obtained by adopting a large number of I/O pins, even at a low operating frequency, and memory density expansion may be achieved by stacking multiple chips using TSV (through-silicon via) technology, as shown in FIG. 1. However, TSV process stability and test coverage should be guaranteed for mass production.

As a kind of SIP (System In Package) solution, for example, a form of stacked memory layers 120 and 130 upon a CPU as shown in FIG. 1 may be configured, where the first memory layer 120 may be designed as 1 Gb single data rate (SDR) Wide I/O mobile SDRAM with 4 channels and 512 DQ pins. The first memory layer 120 may exhibit a 12.8 GB/s data bandwidth by adopting micro bump pads with 1 pF loading. An increase in overall memory density may be achieved by micro bump and TSV based stacking. All 4 channels may be totally independent, and each channel may be made up of, for example, 2 or 4 banks with 128 DQs.

Connectivity of micro bump pads may be tested with simple BST mode. Existing test pad interfaces may be equipped for a wafer probe test, because micro bump pads may be too small to be directly probed. Direct access (DA) mode may be implemented to support failure analysis in SIP type packages. In DA mode, only 32 pins may be needed to test all 4 channels as shown in Table 1, including 4 individual /CS pin. To resolve frequency limitations due to low operating frequency, an SDR type DQ strobe signal may be supported. It may help controllers to locate valid data outputs from a Wide I/O DRAM. A dual period based refresh scheme for reduction of a self refresh current with minimum chip size burden may be included in the first memory layer 120.

Typical metal pads for test purposes may be used where micro bumps cannot be probed directly because of their relatively small and/or reduced size. These test pads may be aligned in a vertical direction at the chip center to allow precise correlation with micro bumps and to reduce skews between channels. With respect to the first memory layer 120, comparison between two configurations of micro bumps and test pads results in Table 3.

|  | Micro Bump | Test Pad |
| --- | --- | --- |
| DQs | x512 | x16 |
| Address | BA[0:1] | BA[0:2] |
|  | RA[0:11] | RA[0:11] |
|  | CA[0:6] | CA[0:11] |
| Internal operation | x512 | x256 or x512 |

Figure 8:
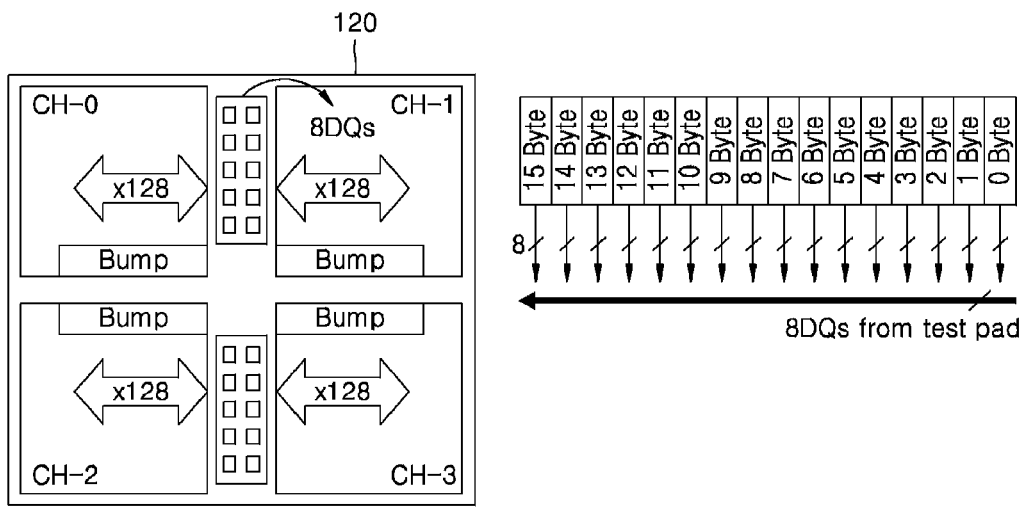

FIG. 8 is a block diagram illustrating a DQ mapping between micro bumps and test pads of FIG. 2. Referring to FIG. 8, the first memory layer 120 may be handled as SDRx128 per channel internally. In a write operation, 16 DQs may be written to all bytes simultaneously. In read operation, selections of 16 out of 512 data may be done with BA[2] for channel and CA[7:9, 11] for 16:1 data mix, which may be for the read out of result data through test pads.

Figure 9:
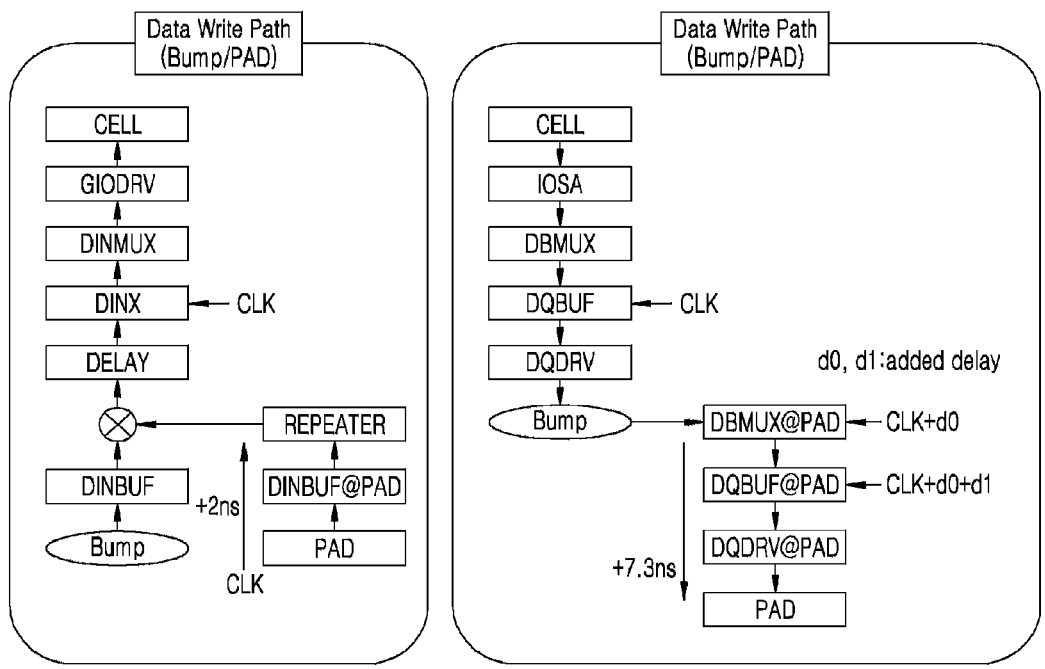

FIG. 9 is a block diagram illustrating a correlation scheme between data write/read operations through micro bumps and through test pads of FIG. 2. Referring to FIG. 9, there may be 9.3 ns delayed outputs measured from test pads that may be compared to those from micro bumps: 2 ns for clock propagation delay and 7.3 ns for data transfer delay from micro bumps to pads. Because outputs from micro bumps and inputs from test pads may be redirected to each other, there may be no timing margin point to be checked for data write/read operations in the path between micro bumps and test pads. With this scheme, validity of all the internal functions including I/O scramble may be checked through test pads.

To resolve frequency limitations due to a speed delay and variation due to low operation voltage at 1.2 V, a read strobe (QS) function may be used which plays a similar role as DQS of DDR.

Figure 10:
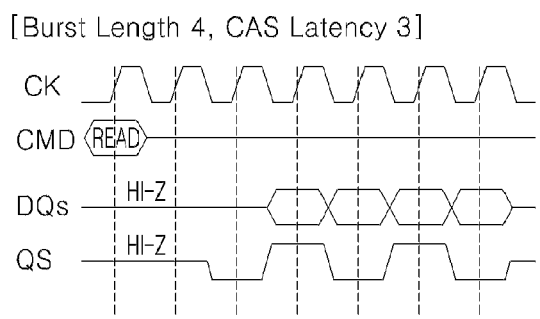

FIG. 10 is a timing diagram of a read strobe (QS) function and power reduction depending on a number of QS pins in a first memory layer of FIG. 2. Referring to FIG. 10, use of the read strobe QS may give more timing margin to controllers, because controllers may fix and optimize input setup/hold time, which may mean an increased timing window to fetch output data from memory. Because QS may be an additive function in SDR, existing DM pins may accommodate the functionalities of QS during read operations. Operations mode of QS may be chosen as SDR, which means QS may be aligned with the rising edge of the clock and may give 50% power reduction compared to a DDR mode. To achieve additional power reduction, a period of QS may be set as two times the clock period. The number of QS may be controlled by an extended mode register set (EMRS) as 1 ea per 8 DQs, 16 DQs or 32 DQs to reduce power consumption.

To reduce a self refresh current, a dual period based refresh scheme may be used. Various methods with differentiated self refresh periods may be tried with additional registers, but the adoption of additional registers and word line based mapping may result in an inevitable increase in chip size.

Figure 11:
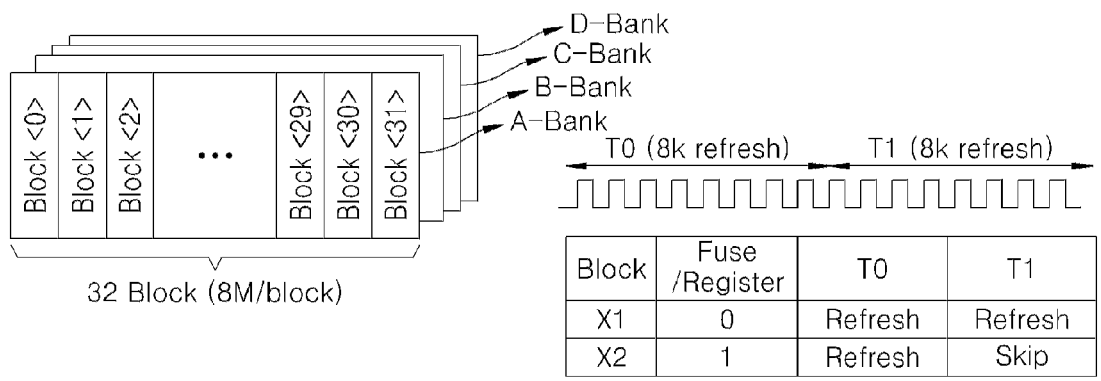

FIG. 11 is a block diagram illustrating a dual period based refresh scheme of the first memory layer 120 of FIG. 2. Referring to FIG. 11, allocation of memory banks in 1-channel of a Wide I/O DRAM for a dual period based refresh scheme is shown. Each bank may be subdivided into 32 sub-blocks according to row addresses, and each channel may have 32 designated bits of refresh information data. Block based mapping of cell array and minimization/reduction of the number of blocks may make it possible to minimize/reduce additional chip size increase. An area of relevant circuits, including metal fuses, registers and logics, may occupy only 0.11% of the total chip area.

All blocks may be classified into 2 types: with an x1 refresh period and with an x2 refresh period. A refresh operation in blocks with the x2 refresh period may be skipped at alternate turns of 8 k refresh (during T1 in FIG. 11). These blocks may be differentiated by their refresh characteristics, which may be recorded by fuse cutting at the test stage in electrical die sorting or stored in internal registers during a built-in self test (BIST) period after a power-up sequence. Refresh data at fuses and internal registers may be combined to determine the refresh period of the corresponding memory block.

Figure 12:
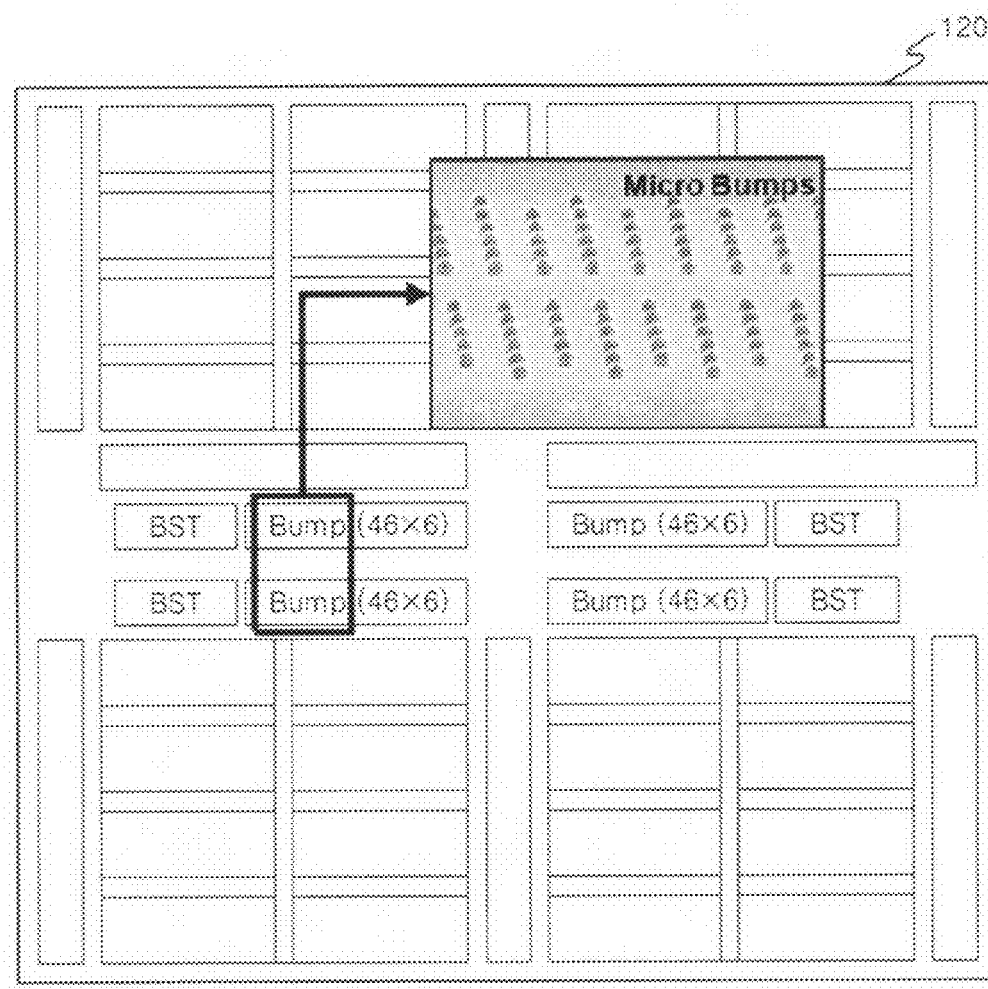
Figure 13:
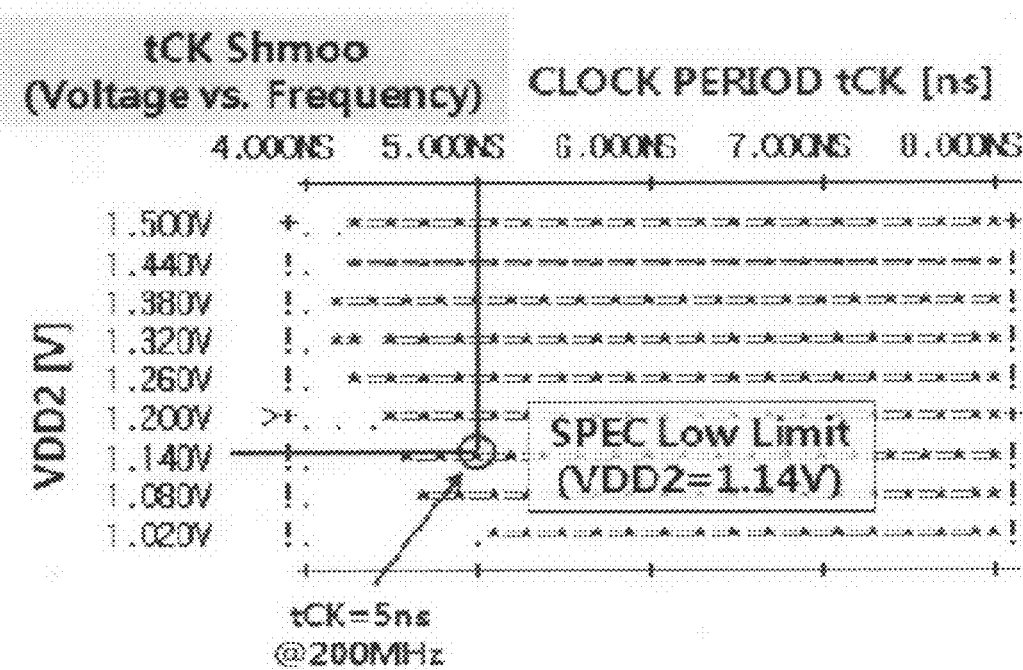

FIG. 12 includes an image of a fabricated Wide I/O DRAM according to at least one example embodiment of the first memory layer 120 of FIG. 2, and a SEM image of fabricated micro bumps in the first memory layer 120. FIG. 13 is a Shmoo plot illustrating a measured voltage characteristic vs. frequency for a Wide I/O DRAM of FIG. 12. Referring to FIG. 13, voltage vs. frequency shmoo plot may be measured from test pads in SDRx16 4-channel operation mode. It may show stable operation at 200 MHz clock frequency. Measurement results may show $t_{ck}$, $t_{RCD}$ and $t_{RP}$ of 4.6 ns, 12.8 ns and 14.0 ns, respectively, at $V_{DD2}$=1.14 V.

Figure 14:
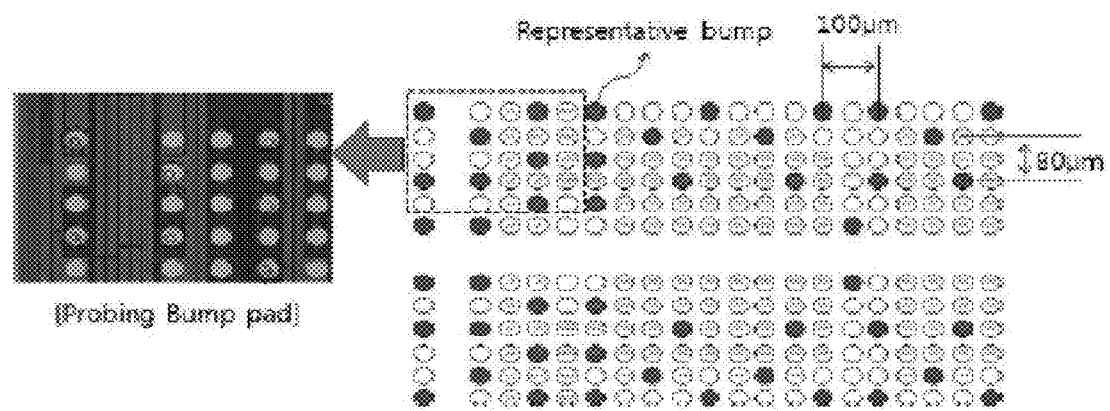

To confirm operations through micro bumps, micro bumps may be probed directly and tested. Due to limits of a wafer probe card, some representative bumps with about an 80 μm pitch may be chosen. Address and command pins may be shared between channel 0/2 and 1/3, and each channel may operate as x8. Because this sharing may give a 2 ns delay in an input signal setup (tSS) and hold (tSH) margin, the first memory layer 120 may be tested at a 100 MHz clock frequency and may be confirmed to be passed in all sorting items. FIG. 14 is an image of probed bumps and location of representative bumps from among micro bumps of the Wide I/O DRAM.

Table 4 shows comparison of features with 1.8 V 1.6 GB/s 1 Gb mobile DDR (LPDDR) SDRAM and 1.2 V 3.2 GB/s 1 Gb LPDDR2, that may be fabricated with the same 50 nm technology.

TABLE 4

|  |  | LPDDR (MDDR) | LPDDR2 | Wide I/O |
| --- | --- | --- | --- | --- |
| Density |  | 1 Gb | 1 Gb | 1 Gb |
| Organization |  | 4Bank/x32 | 8Bank/x32 | 16Bank/x512 |
| VDD [V] |  | 1.8 | 1.8(VDD1) | 1.8(VDD1) |
|  |  |  | 1.2(VDD2) | 1.2(VDD2) |
| Data Rate [MHz] |  | 400 | 800 | 200 |
| Data Bandwidth [GB/s] |  | 1.6 (100%) | 3.2 (200%) | 12.8 (800%) |
| Measured Power [mW] | Standby | 0.32 (100%) | 0.27 (83.3%) | 0.27 (83.3%) |
|  | Read DQ | 215.8 (100%) | 221.2 (102.5%) | 73.7 (34.2%) |
|  | Total | 322.3 (100%) | 372.1 (115.4%) | 330.6 (102.6%) |
| I/O power per bit transfer [mW/Gbps] |  | 17.33 (100%) | 8.71 (50.3%) | 0.78 (4.5%) |

As shown in Table 4, a data bandwidth of Wide I/O may be 8 times LPDDR's and 4 times LPDDR2's because of its 512 I/O pins. However, measured total read power that may include DQ power may amount to only 330.6 mW, almost equal to LPDDR and LPDDR2. Measured I/O power per 1 bit data transfer may be only 0.78 mW/Gbps, which may correspond to 4.5% of LPDDR's. Reduction of I/O power may result from reduction in voltage and I/O loading together with the data bandwidth increase.

To support the 4-channel and 512 I/O feature, chip size of Wide I/O may increase about +25% more than the 1 Gb LPDDR2. However, Wide I/O mobile DRAM may show almost the same standby power as LPDDR and LPDDR2 due to the optimization in number of transistors and circuits.

Figure 15:
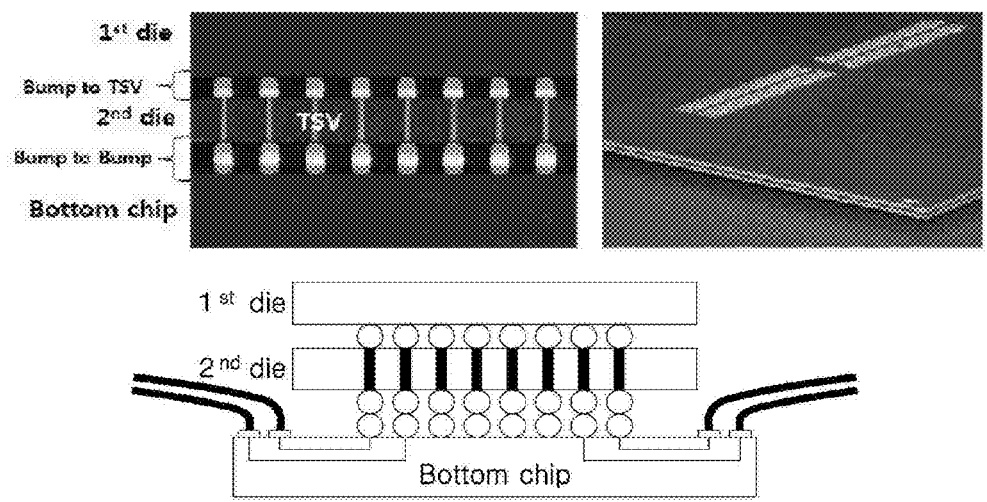

FIG. 15 includes a block diagram and images of 2-stacked Wide I/O DRAMs. Referring to FIG. 15, a vertical section of the 2-stacked Wide I/O DRAMs may be shown. With micro bumps and TSVs, it may be possible to stack 2 Wide I/O DRAM dies on the bottom chip. Fabricated TSVs may each have about a 7.5 µm diameter, 0.22-0.25Ω resistance and 47.4 fF capacitance. The overall yield of these processes may be confirmed to be about 70% from daisy chain packages and function die packages. The connectivity of TSVs may be checked also by performing a boundary scan test (BST).

Figure 16:
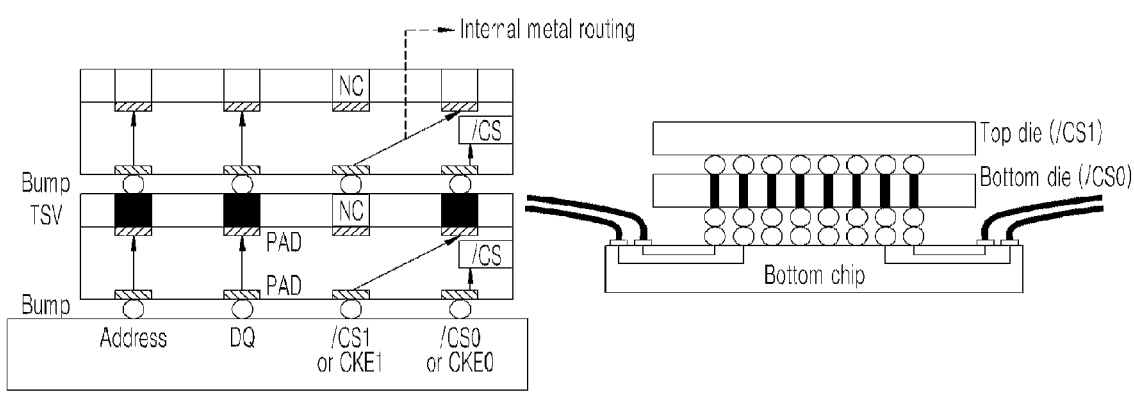
Figure 17:
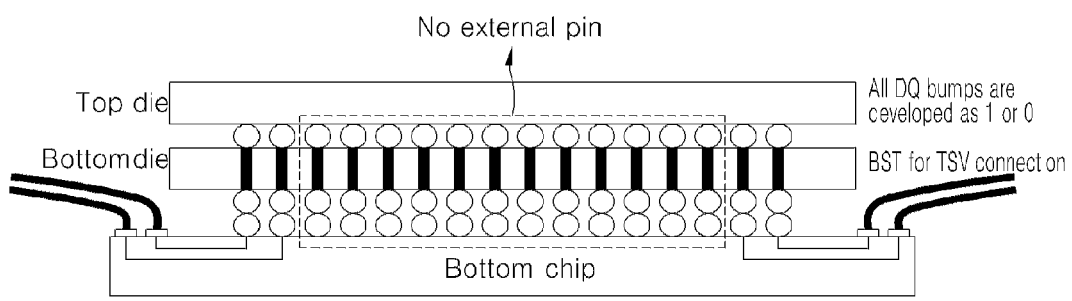

FIG. 16 is a block diagram illustrating a standard fine ball grid array (FBGA) package configuration of 2-stacked Wide I/O DRAMs. FIG. 17 is a block diagram illustrating a boundary scan test configuration of through-silicon vias (TSVs) in 2-stacked Wide I/O DRAMs. Referring to FIG. 16, 2-stacked Wide I/O DRAMs may be packaged on a bottom chip. Representative bumps may be connected again, and /CS and CKE pins for both dies may be separated for individual control. To separate these pins, there may be an inevitable difference between top and bottom dies because they may not share locations for those pins. However, by internal metal re-routing as shown in FIG. 13, two dies may be made exactly the same. Each die may be tested individually by using respective /CS pins.

Connectivity of TSVs, which may not be connected to standard FBGA balls, may be confirmed by the BST. The /SEN pins may be separated for top and bottom dies. To confirm the connections of all DQs without external pins, the bottom die may be tested by giving a read command to the top die and setting all the bumps of the top die as 0 or 1, as shown in FIG. 17. A 1.2 V 1 Gb mobile Wide I/O SDRAM may have stability, the operations of which may be confirmed at 200 MHz clock frequency and VDD2=1.14 V. Due to its wide I/O and optimized read power characteristics, I/O power per bit transfer may be decreased to 4% of that of LPDDR. Adoption of micro bump and TSVs facilitates stacking of multiple dies with 70% yield, and all the connectivity and operations may be confirmed.

Figure 18:
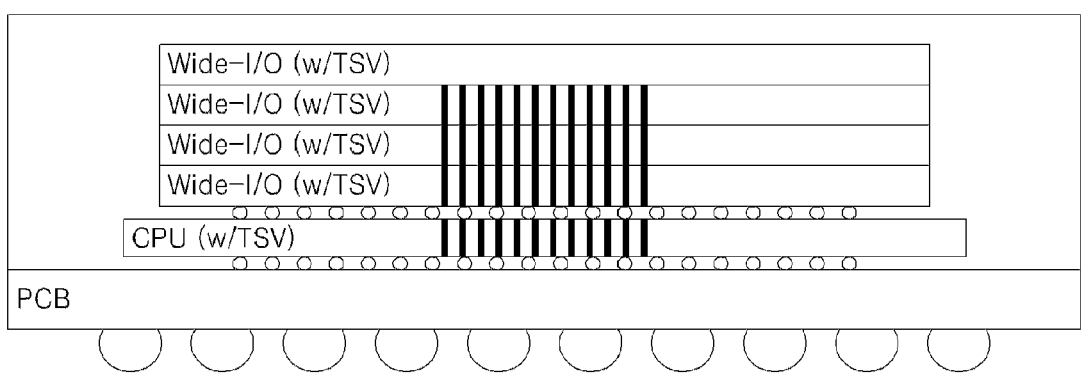
Figure 19:
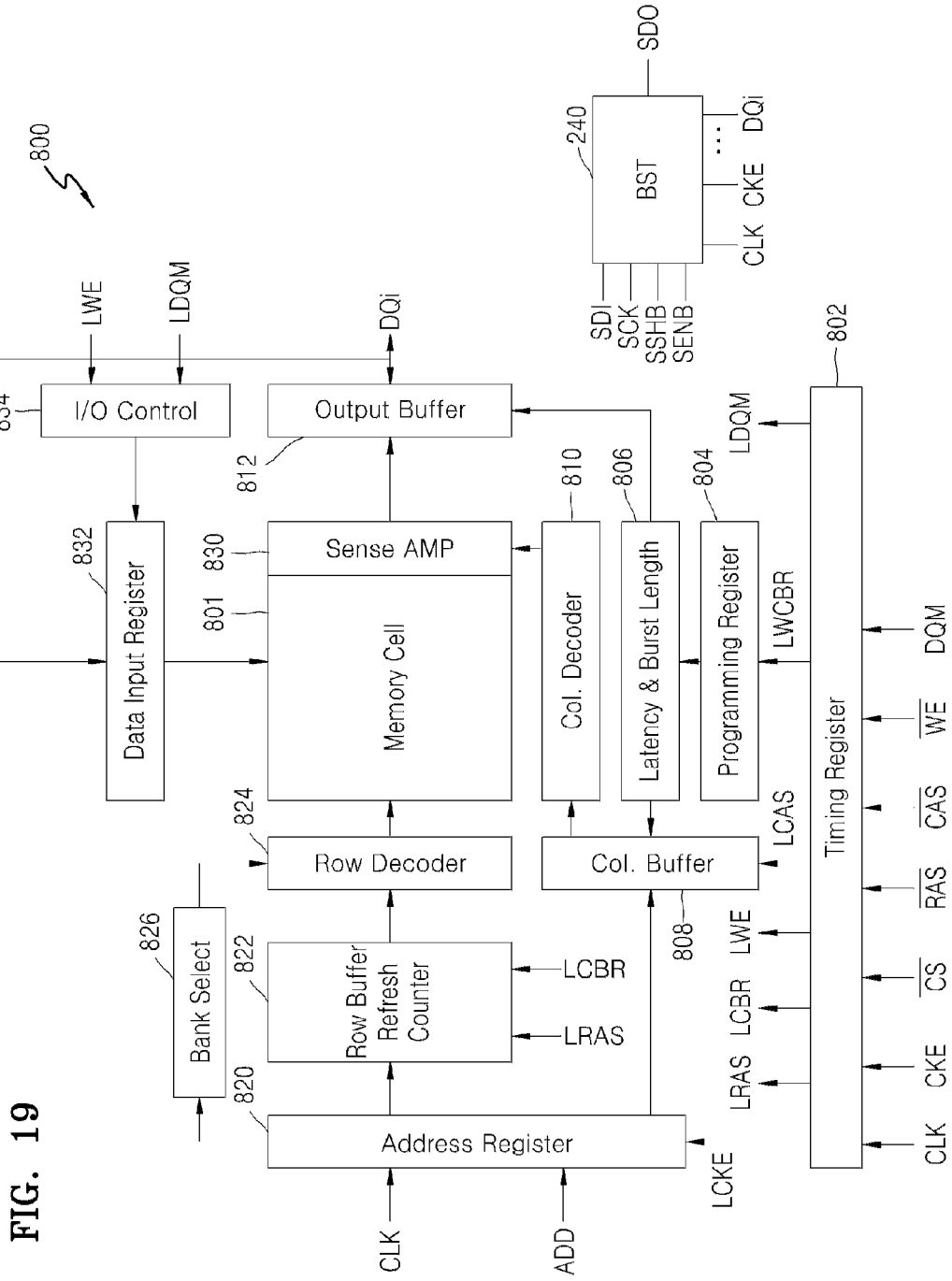

FIG. 18 is a block diagram illustrating a configuration of 4-stacked Wide I/O DRAMs. FIG. 19 is a circuit schematic of an independent 4-channel memory device, each channel being arranged in a quadrant of FIG. 2. Referring to FIG. 18, a 4-channel memory device (120, FIG. 2) may include DDR-SDRAM circuit blocks as shown in FIG. 19, each channel being totally independent and being disposed on 4 partitions as described in example embodiments. For example, a single-channel memory device may be a high bandwidth Wide I/O memory device with a 128 bit data input/output feature.

Referring to FIG. 19, a single-channel memory device 800 may include many different circuit blocks for driving a memory cell array 80 including a DRAM cell and the DRAM cell. For instance, a timing register 802 may be activated when a chip select signal through a /CS pin changes from an inactive level (e.g., logic 'high') to an active level (e.g., logic 'low'). The timing register 802 may receive command signals, for example, a clock signal through a CLK pin, a clock enable signal through a CKE pin, a chip select signal through a CS pin, a row address strobe signal through a RAS pin, a column address strobe signal through CAS pin, a write enable signal through a WE pin, and may generate various internal commands (e.g., LRAS, LCBR, LWE, LCAS, LWCBR and LDQM) by handling the received command signal.

Some internal commands that may be generated by the timing register 802 may be then stored in a programming register 804. For example, latency information, burst length information, and/or the like, related with data output, may be stored in the programming register 804. Internal commands that may be stored in the programming register 804 may be provided to a latency/burst length controller 806, which in turn may provide a control signal for controlling latency and/or burst length of data output for a column decoder 810 and/or an output buffer 812 via a column buffer 808.

An address register 820 may receive an address signal through an ADD pin from outside and clock enable command LCKE from the timing register 802. A row address signal may be provided to a row decoder 824 via a row address buffer 822. A column address signal may be provided to a column decoder 810 via a column address buffer 808. The row address buffer 822 may further receive a refresh address signal, which may be generated by a refresh counter in response to a refresh command (LRAS and/or LCBR), and may provide either a row address or refresh address signals to the row decoder 824. The address register 820 may also provide a bank signal for the address register 820 via bank select 826 to select a bank.

The row decoder 824 may decode the row address signal and/or the refresh address signal, which may be input from the row address buffer 822 and may activate a word-line of the memory cell array 801. The column decoder 810 may decode the column address signal and may make a selection of a bit-line of the memory cell array 801. For example, a column selection line may be applied to the semiconductor memory device 800 and thus a selection may be made through the column selection line.

A sense amplifier 830 may amplify memory cell data selected by the row and column decoders 824 and 810 and may provide the result to an output buffer 812. Data for a data cell record may be provided to the memory cell array 801 via a data input register 832, and the input/output controller 834 may control data transfer operations of the data input register 832.

The BST block 240 may test connectivity of all micro bumps of the single-channel memory device 800. The BST block 240 may test good or bad connectivity of micro bumps with a scan shift signal through a SSHB pin, a scan clock through a SCK pin, a scan input signal through a SDI pin, and a scan output signal through a SDO pin, which are provided via test pads. According to at least one example embodiment, the clock of the CLK pin, the clock enable signal of CKE, the chip select signal of /CS, the row address strobe signal of /RAS, the column address strobe signal of /CAS, the write enable signal of /WE, the data input/output mask signal of DQM, the address signal of ADD, the data input/output signal of DQi may be provided through micro bumps.

Figure 20:
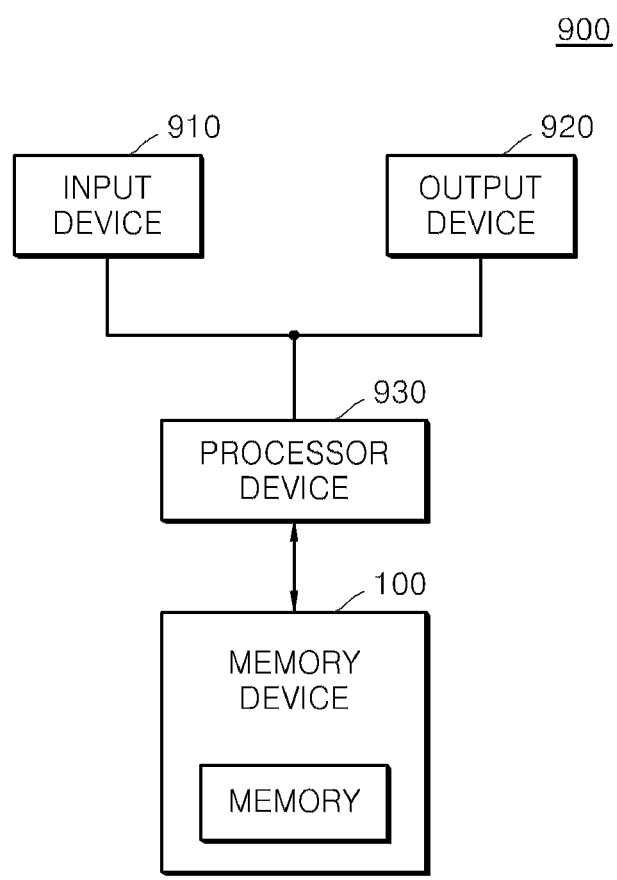

FIG. 20 is a block diagram illustrating electronic system applications including semiconductor devices according to example embodiments. Referring to FIG. 20, an electronic system 900 may include an input device 910, an output device 920, a processor device 930 and a semiconductor device 100 (e.g., a memory device including a memory). The processor device 920 may control the input device 910, output device 920, and the semiconductor device 100 through respective interfaces. The processor device 930 may include at least any one of at least one micro processor, a digital signal processor, a micro controller, and logic devices capable of performing similar functions to those of the micro processor, digital signal processor, and micro controller. The input device 910 may include at least one of keyboards, keypads, and/or the like, and the output device 920 may include any display device.

The semiconductor device 100 may be configured as the semiconductor package 100 shown in FIG. 1, which may have stacked volatile and non-volatile memory devices, for example, flash memory. The semiconductor device 100 in a first example may include micro bumps and a BST block for testing connectivity of the micro bumps by scanning data input to the micro bumps and outputting the scanned data. The semiconductor device 100 according to at least one example embodiment may include a number of channels with a plurality of micro bumps, and a BST block for testing connectivity of the micro bumps by scanning data input in parallel or in series to micro bumps of each channel and outputting the scanned data. The semiconductor device 100 according to at least one example embodiment may be configured as a semiconductor package that may include a first chip with one or more solder balls and one or more switches that may be electrically coupled with the solder balls, and a second chip that may be stacked on top of the first chip, which may be electrically coupled with the switches in DA mode and may have at least one or more micro bumps for inputting/outputting a signal forwarded from/to the solder balls.

Figure 21:
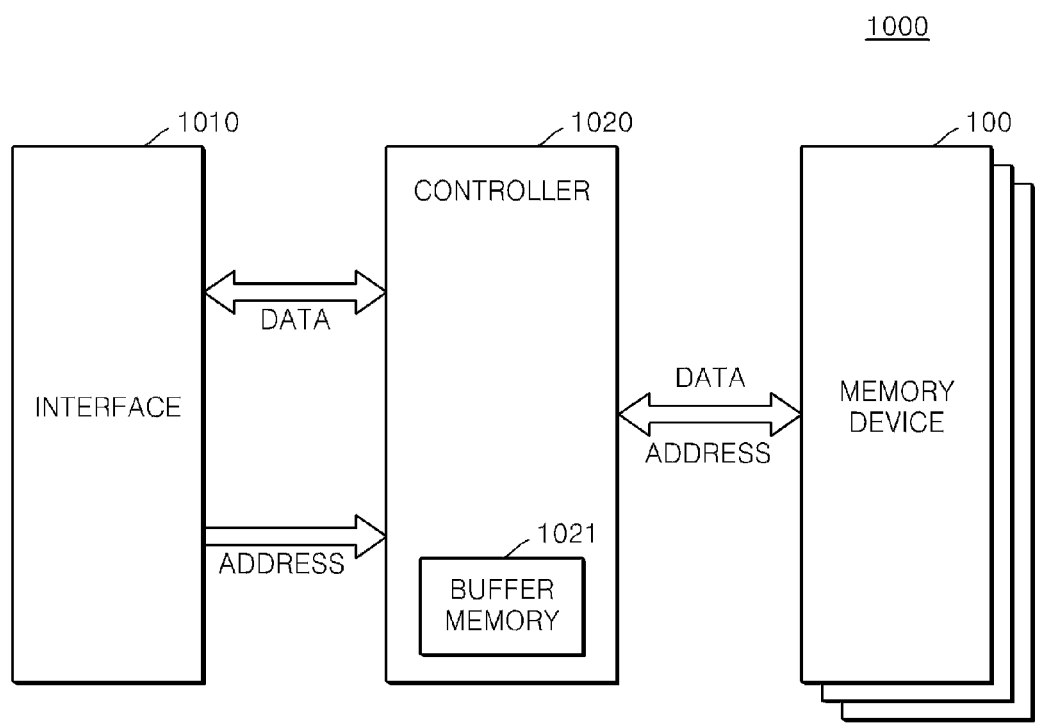

FIG. 21 is a block diagram illustrating a memory system application using a semiconductor device according to example embodiments. Referring to FIG. 21, a memory system 1000 may include an interface 1010, a controller 1020 and a semiconductor device 100. The interface 1010 may include a corresponding data exchange protocol to interface with a host. The interface 1010 may be configured to communicate with the host through any of various protocols, for example, USB (Universal Serial Bus), MMC (Multi-Media Card), PCI-E (Peripheral Component Interconnect-Express), SAS (serial-attached SCSI), SATA (Serial Advanced Technology Attachment), PATA (Parallel Advanced Technology Attachment), SCSI (Small Computer System Interface), ESD (Enhanced Small Disk Interface), IDE (Integrated Drive Electronics) and/or the like.

The controller 1020 may be provided with data and addresses from an external host through the interface 1010. The controller 1020 may access the semiconductor device 100 by referring to the data and addresses provided by the host. The controller 1020 may forward data read from the semiconductor device 100 toward the host via the interface 1010.

The controller 1020 may include a buffer memory 1021. The buffer memory 1021 may temporarily store write data from the host and/or read data from the semiconductor device. At the read request from the host, when data may have been cached in the semiconductor device 100, the buffer memory 1021 may support a cache function of directly providing the cached data to the host. In general, a data transfer rate in a bus format of the host (e.g., SATA and/or SAS) may be faster than that of a memory channel within the memory system 1000. If an interface speed of the host is much faster, performance degradation due to a speed gap may be minimized and/or reduced by providing a buffer memory 1021.

The semiconductor device 100 may include micro bumps, and may include the BST block for testing connectivity of the micro bumps by scanning data input to the micro bumps and outputting the scanned data. The semiconductor device 100 may include a number of channels with a plurality of micro bumps, and may include a BST block for testing connectivity of the micro bumps by scanning data input in parallel and/or in series to micro bumps of each channel and outputting the scanned data, where BST blocks of all channels may be interconnected, and thus connectivity of all micro bumps may be tested. The semiconductor device 100 may be configured as a semiconductor package including a first chip that may include at least one or more solder balls and at least one or more switches may be electrically coupled with the solder balls, and a second chip may be stacked on top of the first chip, which may be electrically coupled with the switches in DA mode and may include one or more micro bumps for inputting/outputting a signal forwarded from/to the solder balls.

The semiconductor device 100 may be a storage medium of the memory system 1000. For example, the semiconductor device 100 may be implemented as a resistive memory device. According to at least one example embodiment, the semiconductor device 100 may be implemented as a NAND-type flash memory with mass storage capacity. The semiconductor device 100 may include a plurality of memory devices. As a storage medium, the semiconductor device 100 may be used as Parameter Random Access Memory (PRAM), Magnetoresistive Random Access Memory (MRAM), Resistive Random Access Memory (ReRAM), Ferroelectric Random Access Memory (FRAM), NOR-type flash memory, or a combination of these.

Figure 22:
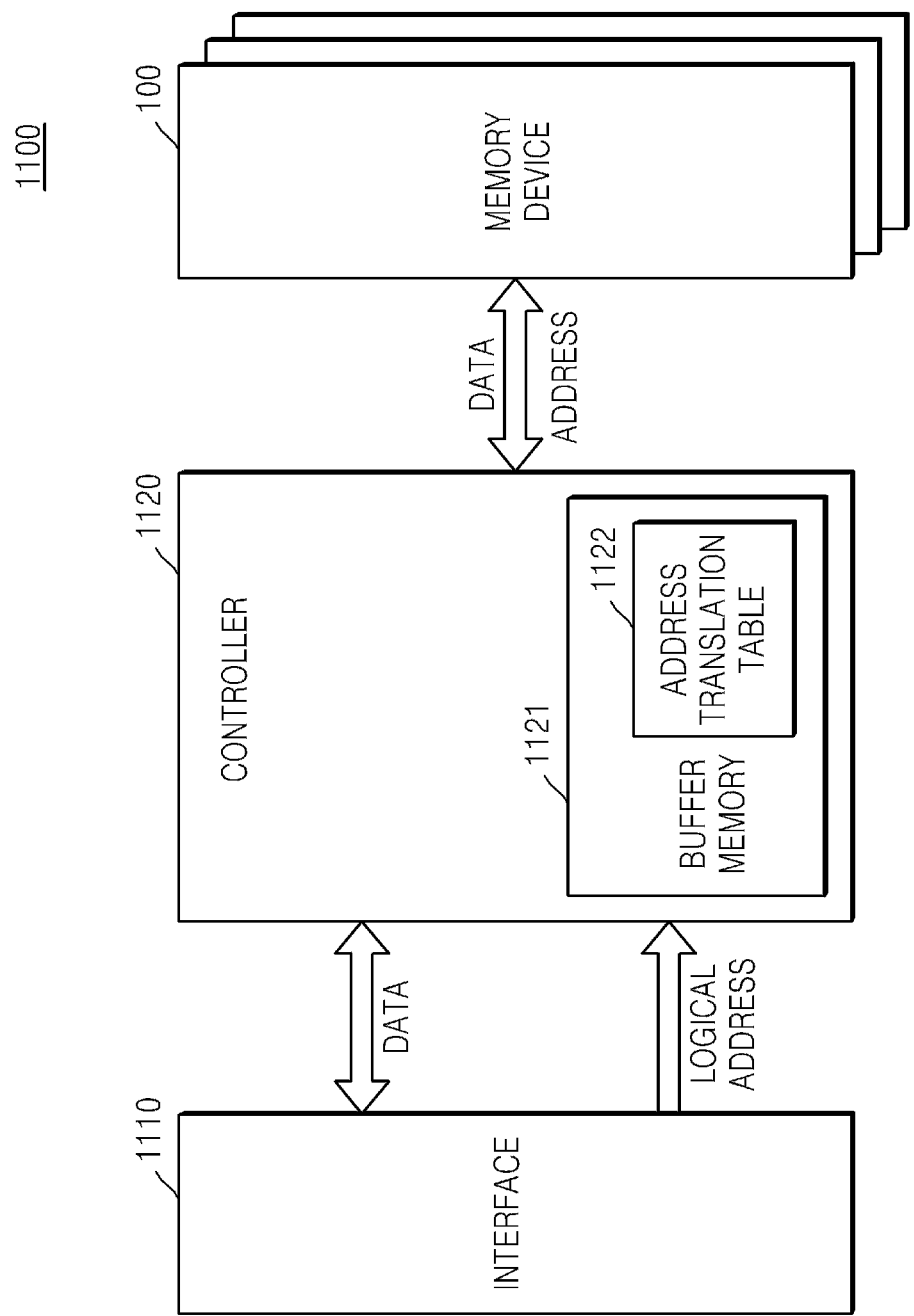

FIG. 22 is a block diagram illustrating a memory system application using a semiconductor device according to still other example embodiments. Referring to FIG. 22, a memory system 1100 may include an interface 1110, a controller 1120 and a semiconductor device 100. The interface 1110 may include a corresponding data exchange protocol to interface with a host (e.g., as described in FIG. 21). The semiconductor device 100 may include a BST block for testing connectivity of micro bumps according to example embodiments, and may be configured as a semiconductor disk device (SSD) that may support DA mode in which a middle stacked chip may be directly tested with a switch connected between solder balls and micro bumps. The memory system 1100 may also be referred to as a flash memory system.

The controller 1120 may include a buffer memory 1121 in which an address translation table 1122 may be configured. The controller 1120 may translate a logical address that may be provided through the interface 1110 into a physical address by referring to the address translation table 1122. The controller 1120 may then access the semiconductor device 100 by referring to the translated physical address.

The memory systems 1000 and 1100 illustrated in FIGS. 21 and 22 may be installed in information handling devices, for example, personal digital assistants (PDAs), portable computers, web tablets, digital cameras, portable media players (PMPs), mobile phones, wireless phones, laptop computers, and/or the like. The memory systems 1000 and 1100 may be configured to be MMC cards, Secure Digital (SD) cards, micro-SD cards, memory sticks, ID cards, Personal Computer Memory Card International Association (PCMCIA) cards, chip cards, USB cards, Smart cards, Compact Flash (CF) cards, and/or the like.

While example embodiments have been particularly shown and described, it will be understood by one of ordinary skill in the art that variations in form and detail may be made therein without departing from the spirit and scope of the claims.

What is claimed is:

1. A semiconductor device, comprising:
   at least one through electrode;
   at least one micro bump; and
   a boundary scan test block configured to test micro bump connectivity by scanning data input to the at least one micro bump and outputting the scanned data, the boundary scan test block includes a scan chain having a plurality of selection units and a plurality of flip-flops,
   wherein the plurality of selection units are connected in parallel with respect to the plurality of flip flops.

2. The semiconductor device of claim 1, wherein the boundary scan test block further includes:
- a mode controller configured to receive a scan enable signal, a scan shift signal, and a scan clock to control operation modes of the scan chain, and
- a first selection unit of the plurality of selection units of the scan chain is configured to
  - receive a scan input signal as a first input,
  - receive the data input to the at least one micro bump as a second input, and
  - select and output one of the first input and the second input based on the scan shift signal, and
- a first flip-flop of the plurality of flip-flops is configured to output the selected one of the first and second inputs based on the scan clock.

3. The semiconductor device of claim 2, wherein the output of the first flip flop is a scan output signal.

4. The semiconductor device of claim 3, further comprising:
- test pads,
- wherein the semiconductor device is configured such that the test pads conduct the scan enable signal, the scan shift signal, the scan clock, the scan input signal and the scan output signal.

5. The semiconductor device of claim 2, wherein
- the at least one micro bump is a plurality of micro bumps,
- the scan chain includes a second selection unit and a second flip-flop, the second selection unit and the second flip-flop being connected to the first selection unit and the first flip-flop,
- the second selection unit is configured to
  - receive the output of the first flip-flop as a first input,
  - receive data from a micro bump of the plurality of micro bumps as a second input, and
  - select and output one of the first and second inputs of the second selection unit, and
- the second flip-flop is configured to output the one of the first and second inputs of the second selection unit as a scan output signal according to the scan clock.

6. The semiconductor device of claim 5, wherein the mode controller is configured to set a parallel-in mode in which signals of all of the plurality of micro bumps are input based on the scan shift signal.

7. The semiconductor device of claim 5, wherein the mode controller is configured to set a serial-out and shift mode in which signals input to the plurality of micro bumps are shifted based on the scan clock and output as the scan output signal.

8. The semiconductor device of claim 5, wherein the mode controller is configured to set a serial-in/out and shift mode in which the scan input signal is input based on the scan shift signal, shifted based on the scan clock and output as the scan output signal.

9. The semiconductor device of claim 1, further comprising,
- a plurality of channels,
- wherein the at least one micro bump is at least four micro bumps,
- the at least one boundary scan test block is a plurality of boundary scan test blocks,
- each of the channels includes a plurality of the micro bumps and at least one of the boundary scan test blocks,
- the boundary scan test blocks of the plurality of channels are connected to each other, and
- the semiconductor device is configured to test the connectivity of all of the micro bumps.

10. A memory system, comprising:
- an interface;
- a controller including a buffer memory; and
- a memory device including the semiconductor device of claim 1.

11. A semiconductor package, comprising:
- a first chip including at least one solder ball and at least one switch electrically connected to the at least one solder ball;
- a second chip stacked on the first chip and electrically connected to the at least one switch in a direct access mode, the second chip including at least one micro bump configured to input/output signals transmitted from/to the at least one solder ball; and
- a semiconductor device including at least one boundary scan test block configured to test micro bump connectivity, the at least one boundary scan test block includes a scan chain having a plurality of selection units and a plurality of flip-flops,
- wherein the plurality of selection units are connected in parallel with respect to the plurality of flip flops.

12. The semiconductor package of claim 11, wherein the first chip includes a first input/output buffer, the first input/output buffer connected to the at least one solder ball to connect an external interface of the semiconductor package.

13. The semiconductor package of claim 12, wherein the first input/output buffer is configured with a drive capability to drive signals for the external interface.

14. The semiconductor package of claim 13, wherein the second chip includes a second input/output buffer, the second input/output buffer connected to the at least one micro bump, the second input/output buffer not configured with a drive capability.

15. The semiconductor package of claim 12, wherein the first input/output buffer includes an electrostatic discharge protection circuit.

16. The semiconductor package of claim 15, wherein the second chip includes a second input/output buffer, the second input/output buffer connected to the at least one micro bump, the second input/output buffer not including an electrostatic discharge protection circuit.

17. The semiconductor package of claim 11, wherein the at least one switch is configured to switch a connection to the at least one solder ball between a memory controller and the at least one micro bump.

18. A memory system, comprising:
- an interface;
- a controller; and
- a memory device including the semiconductor package of claim 11.

19. A semiconductor package, comprising:
- a first chip including at least one solder ball and at least one switch electrically connected to the at least one solder ball;
- a second chip stacked on the first chip and electrically connected to the at least one switch in a direct access mode, the second chip including at least one micro bump configured to input/output signals transmitted from/to the at least one solder ball; and
- a semiconductor device including at least one through electrode, at least one micro bump and at least one boundary scan test block configured to test micro bump connectivity by scanning data input to the micro bump of the semiconductor device and outputting the scanned data, a boundary scan test block configured to test micro bump connectivity by scanning data input to the at least one micro bump and outputting the scanned data, the at least one boundary scan test block includes a scan chain having a plurality of selection units and a plurality of flip-flops, wherein the plurality of selection units are connected in parallel with respect to the plurality of flip flops.

20. The semiconductor package of claim 19, wherein the semiconductor package is configured in a 4-stacked Wide I/O DRAM configuration, and the semiconductor device is part of a third chip stacked on the second chip.

21. The semiconductor device of claim 19, wherein the at least one through electrode passes through a through silicon via (TSV).

22. An electronic system, comprising:
an input device;
an output device;
a processor; and
the semiconductor package of claim 19.

* * * * *